(12) United States Patent
Hojo et al.

(10) Patent No.: US 10,700,089 B1
(45) Date of Patent: Jun. 30, 2020

(54) THREE-DIMENSIONAL MEMORY DEVICE INCLUDING LOCALLY THICKENED ELECTRICALLY CONDUCTIVE LAYERS AND METHODS OF MANUFACTURING THE SAME

(71) Applicant: SANDISK TECHNOLOGIES LLC, Addison, TX (US)

(72) Inventors: Naoto Hojo, Yokkaichi (JP); Takahiro Tabira, Kuwana (JP); Yoshitaka Otsu, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/273,523

(22) Filed: Feb. 12, 2019

(51) Int. Cl.
| | |
|---|---|
| *H01L 27/11582* | (2017.01) |
| *H01L 27/11565* | (2017.01) |
| *H01L 27/1157* | (2017.01) |
| *H01L 27/11573* | (2017.01) |
| *H01L 21/311* | (2006.01) |
| *H01L 21/768* | (2006.01) |
| *H01L 21/28* | (2006.01) |

(Continued)

(52) U.S. Cl.
CPC .. *H01L 27/11582* (2013.01); *H01L 21/31116* (2013.01); *H01L 21/76802* (2013.01); *H01L 27/1157* (2013.01); *H01L 27/11565* (2013.01); *H01L 27/11573* (2013.01); *H01L 29/40117* (2019.08); *H01L 27/11519* (2013.01); *H01L 27/11524* (2013.01); *H01L 27/11526* (2013.01); *H01L 27/11556* (2013.01)

(58) Field of Classification Search
CPC ......... H01L 27/11582; H01L 29/40117; H01L 21/31116; H01L 27/11565; H01L 21/76802; H01L 27/11573; H01L 27/1157; H01L 27/11556; H01L 27/11524; H01L 27/11519; H01L 27/11526
USPC ........................................................ 257/324
See application file for complete search history.

(56) References Cited

U.S. PATENT DOCUMENTS

| | | |
|---|---|---|
| 5,915,167 A | 6/1999 | Leedy |
| 9,716,105 B1 | 7/2017 | Tsutsumi |

(Continued)

OTHER PUBLICATIONS

Endoh, T. et al., "Novel Ultra High Density Flash Memory with a Stacked-Surrounding Gate Transistor (S-GT) Structured Cell," IEDM Proc., pp. 33-36, (2001).

(Continued)

*Primary Examiner* — Karen Kusumakar
*Assistant Examiner* — Adam S Bowen
(74) *Attorney, Agent, or Firm* — The Marbury Law Group, PLLC

(57) ABSTRACT

Fabricating a three-dimensional memory device may include forming an alternating stack of insulating layers and sacrificial material layers over a substrate. Stepped surfaces are formed by patterning the alternating stack. Sacrificial pads are formed on physically exposed horizontal surfaces of the sacrificial material layers. A retro-stepped dielectric material portion is formed over the sacrificial pads. After memory stack structures extending through the alternating stack are formed, the sacrificial material layers and the sacrificial pads can be replaced with replacement material portions that include electrically conductive layers. The electrically conductive layers can be formed with thicker end portions. Contact via structures can be formed on the thicker end portions.

15 Claims, 41 Drawing Sheets

(51) Int. Cl.
*H01L 27/11556* (2017.01)
*H01L 27/11519* (2017.01)
*H01L 27/11524* (2017.01)
*H01L 27/11526* (2017.01)

(56) References Cited

U.S. PATENT DOCUMENTS

| | | |
|---|---|---|
| 9,905,573 B1 | 2/2018 | Mada et al. |
| 9,960,181 B1 | 5/2018 | Cui et al. |
| 10,192,877 B2 | 1/2019 | Norizuki et al. |
| 2016/0111438 A1* | 4/2016 | Tsutsumi .......... H01L 27/11575 257/314 |
| 2016/0365351 A1* | 12/2016 | Nishikawa .......... H01L 27/1157 |
| 2016/0365352 A1* | 12/2016 | Nishikawa ........ H01L 27/11582 |
| 2018/0040627 A1* | 2/2018 | Kanakamedala ............................ H01L 27/11582 |
| 2018/0061850 A1 | 3/2018 | Mada et al. |
| 2018/0158873 A1 | 6/2018 | Sano et al. |
| 2018/0261611 A1 | 9/2018 | Norizuki et al. |

OTHER PUBLICATIONS

U.S. Appl. No. 15/805,599, filed Nov. 7, 2017, SanDisk Technologies LLC.
U.S. Appl. No. 15/813,579, filed Nov. 15, 2017, SanDisk Technologies LLC.
U.S. Appl. No. 15/813,625, filed Nov. 15, 2017, SanDisk Technologies LLC.
U.S. Appl. No. 15/873,101, filed Jan. 17, 2018, SanDisk Technologies LLC.
U.S. Appl. No. 15/950,356, filed Apr. 11, 2018, SanDisk Technologies LLC.
U.S. Appl. No. 15/950,505, filed Apr. 11, 2018, SanDisk Technologies LLC.
U.S. Appl. No. 15/950,616, filed Apr. 11, 2018, SanDisk Technologies LLC.
U.S. Appl. No. 15/956,139, filed Apr. 18, 2018, SanDisk Technologies LLC.
U.S. Appl. No. 16/002,265, filed Jun. 7, 2018, SanDisk Technologies LLC.
U.S. Appl. No. 62/747,047, filed Oct. 17, 2018, SanDisk Technologies LLC.

* cited by examiner

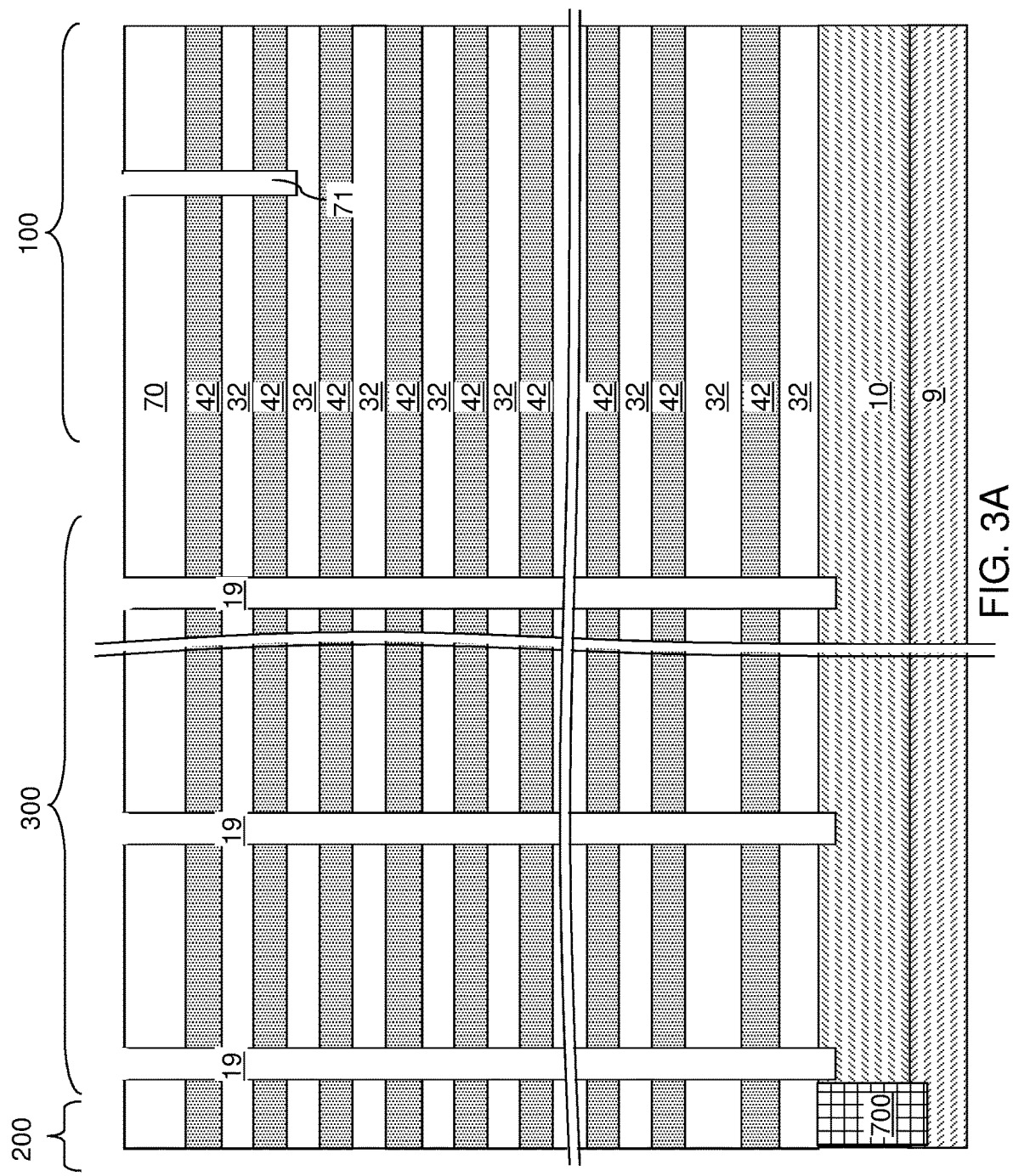

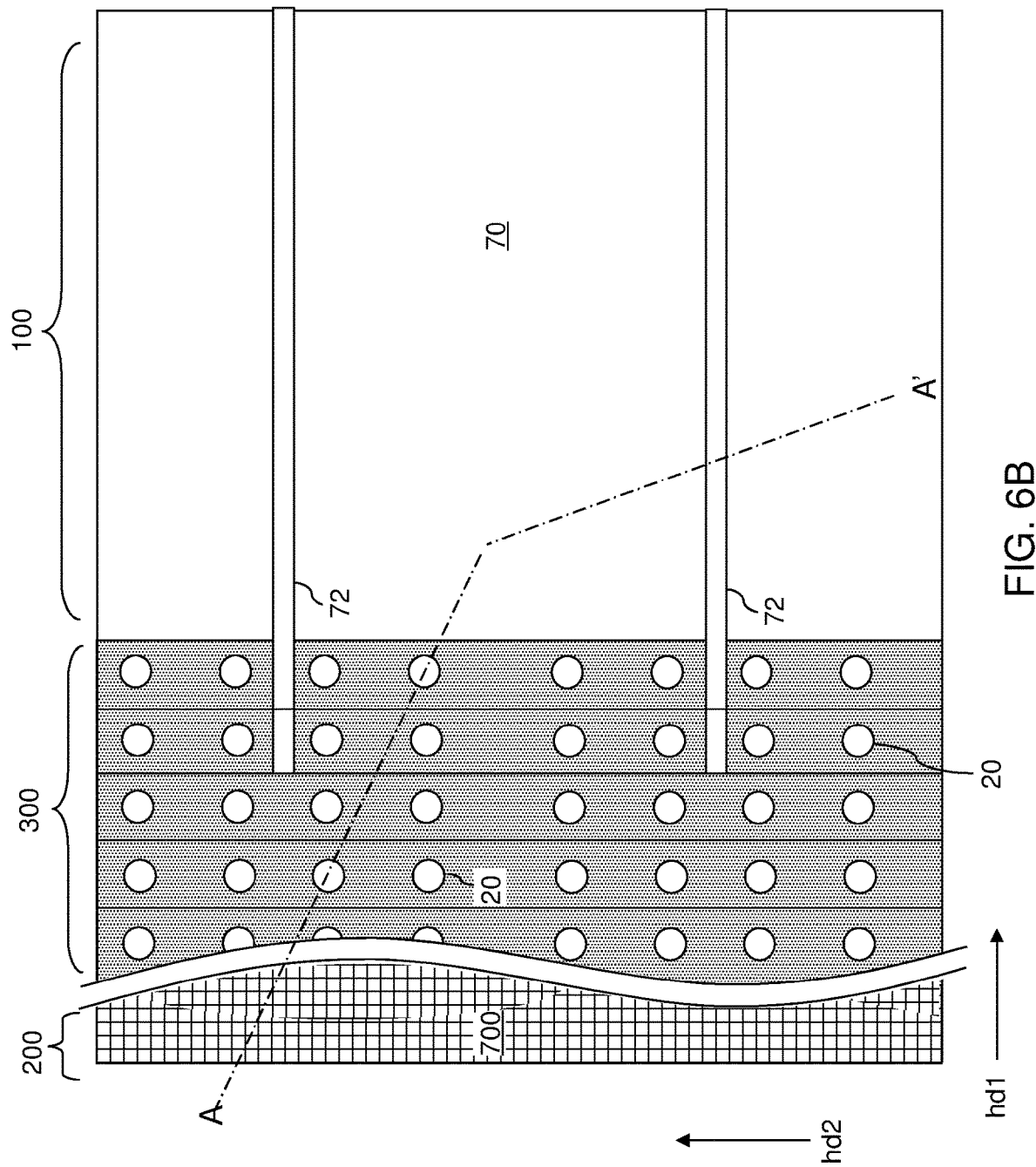

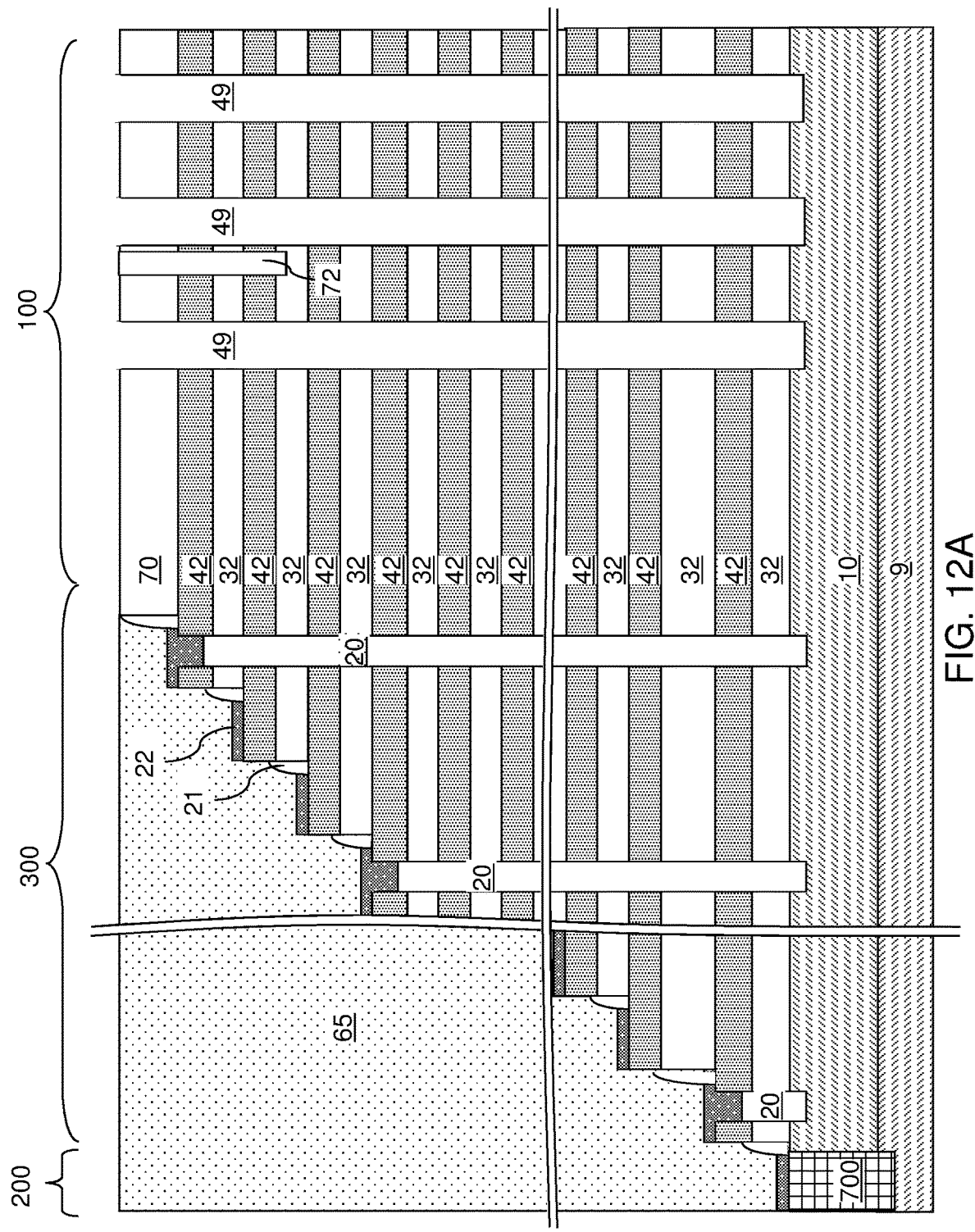

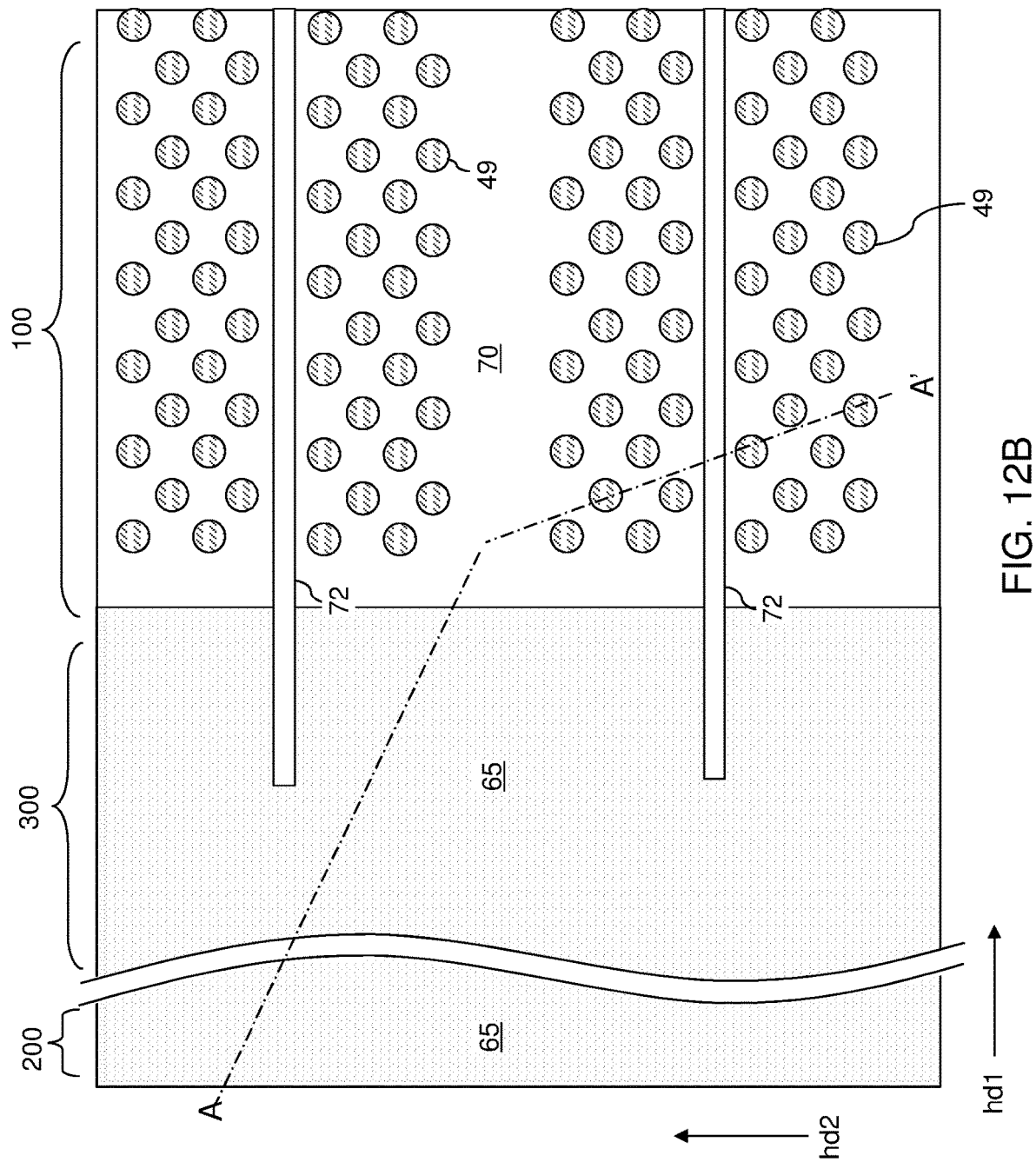

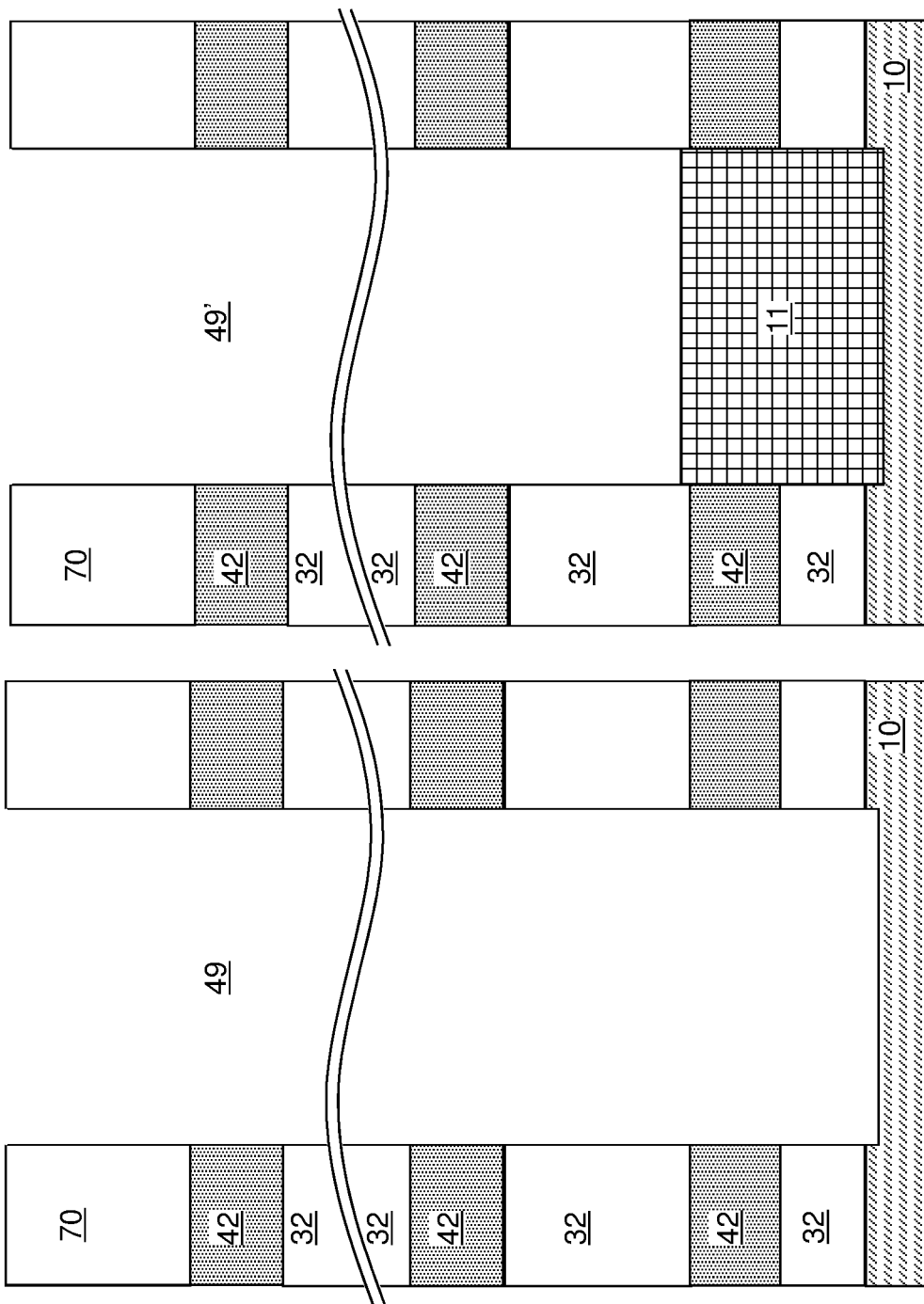

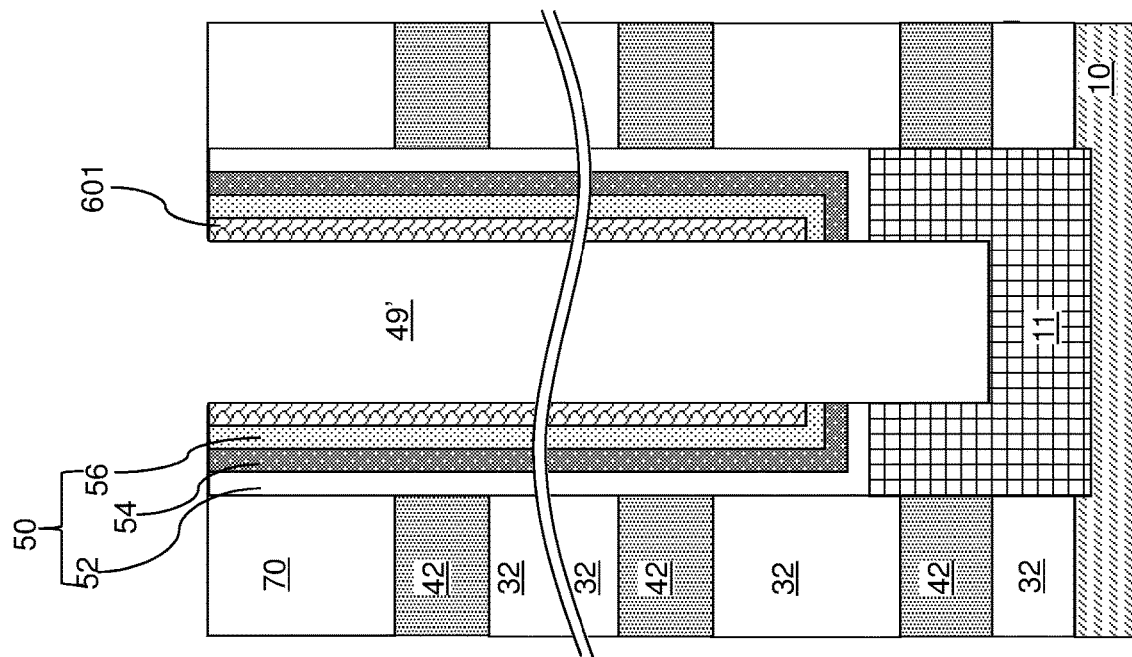
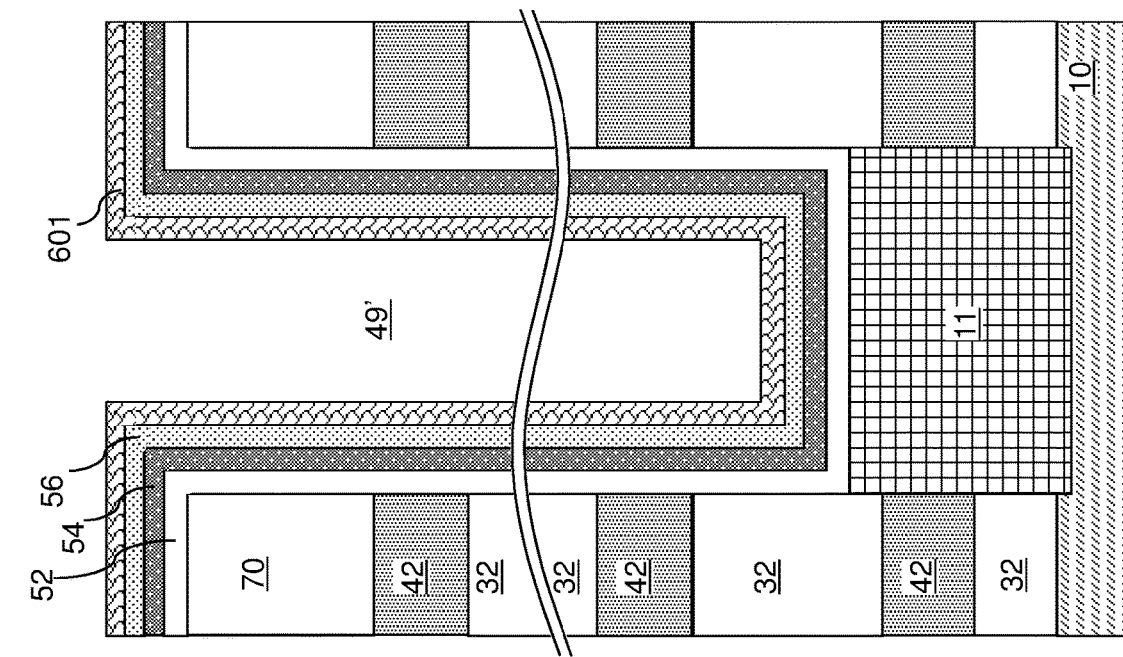

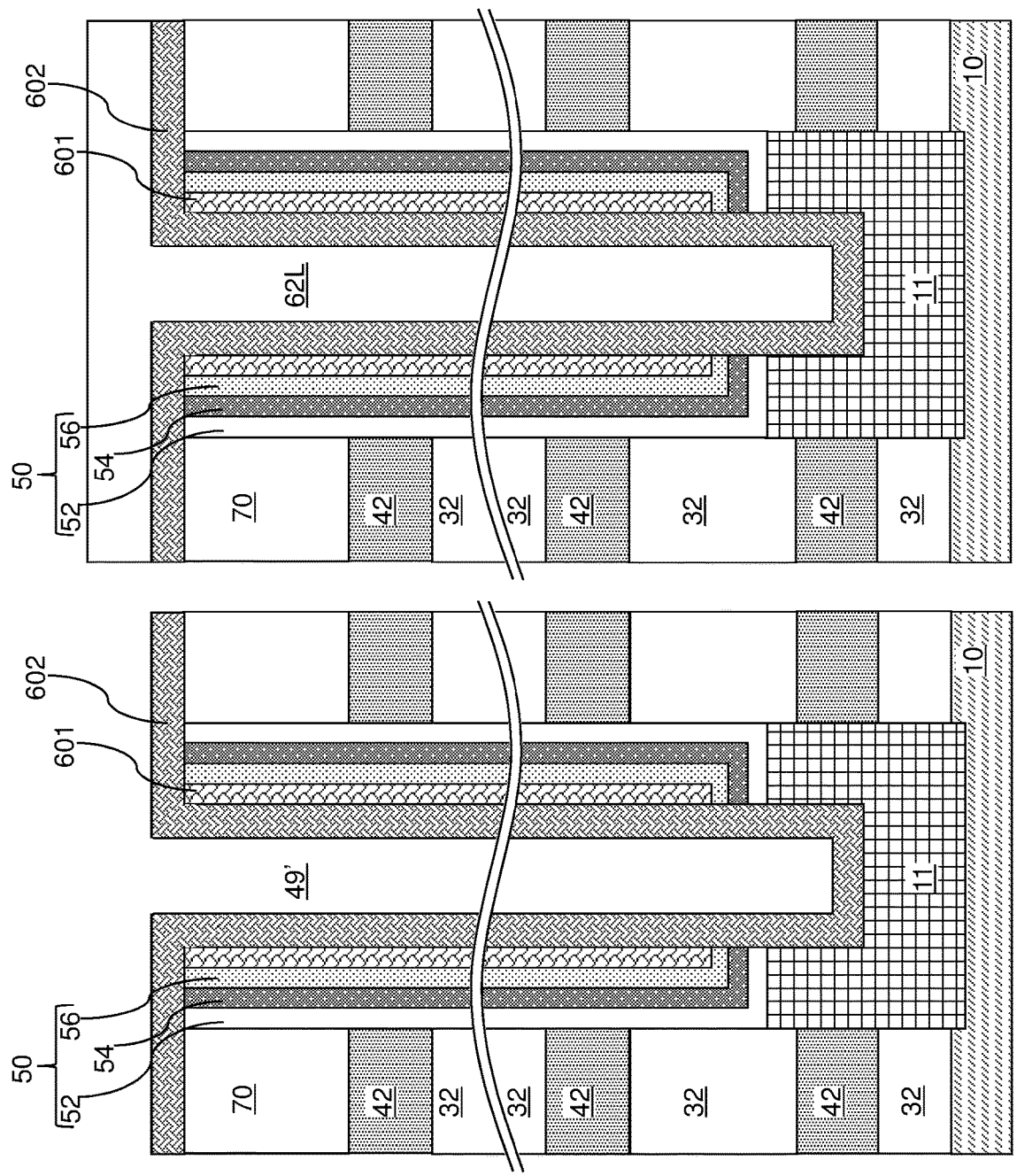

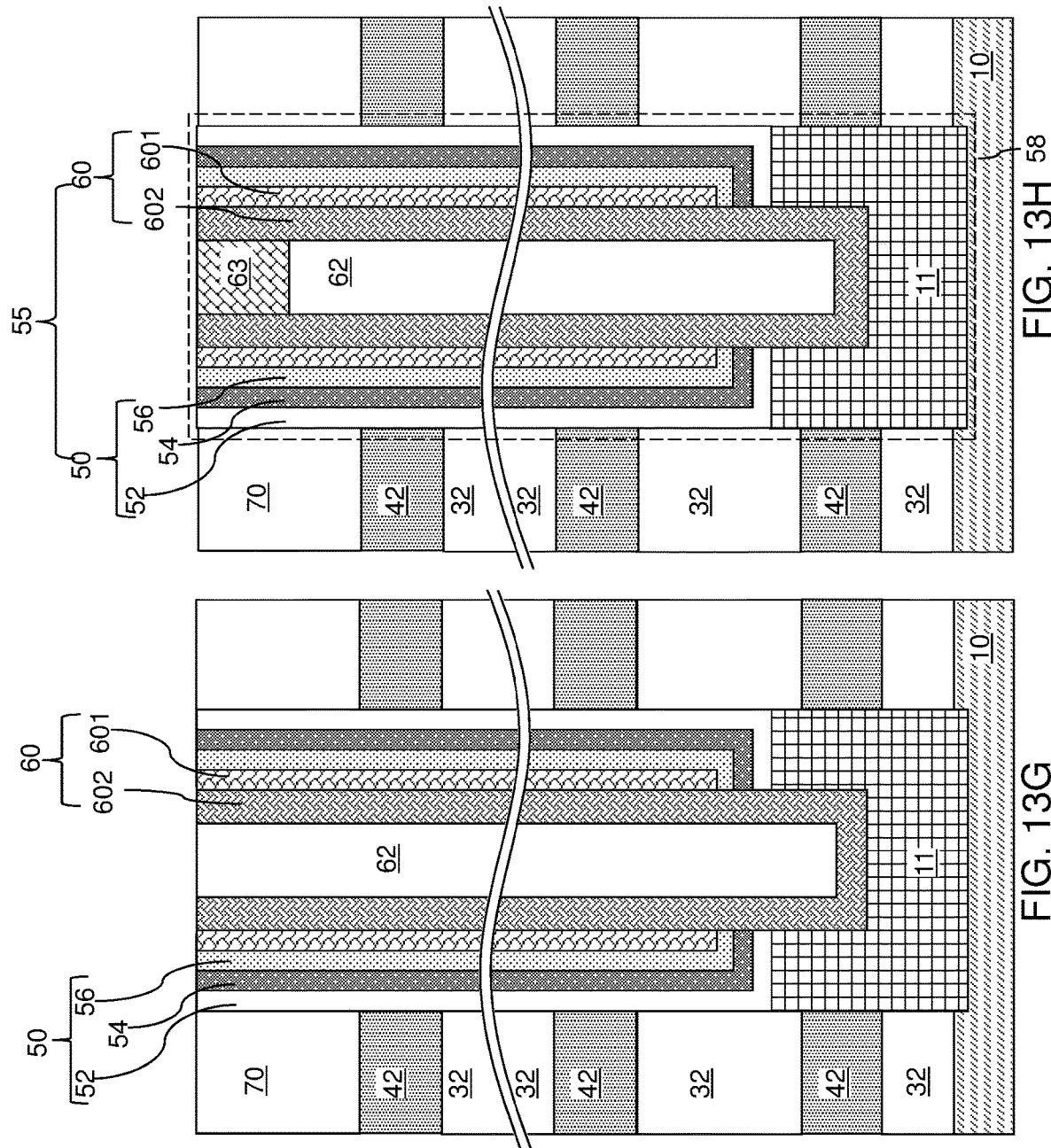

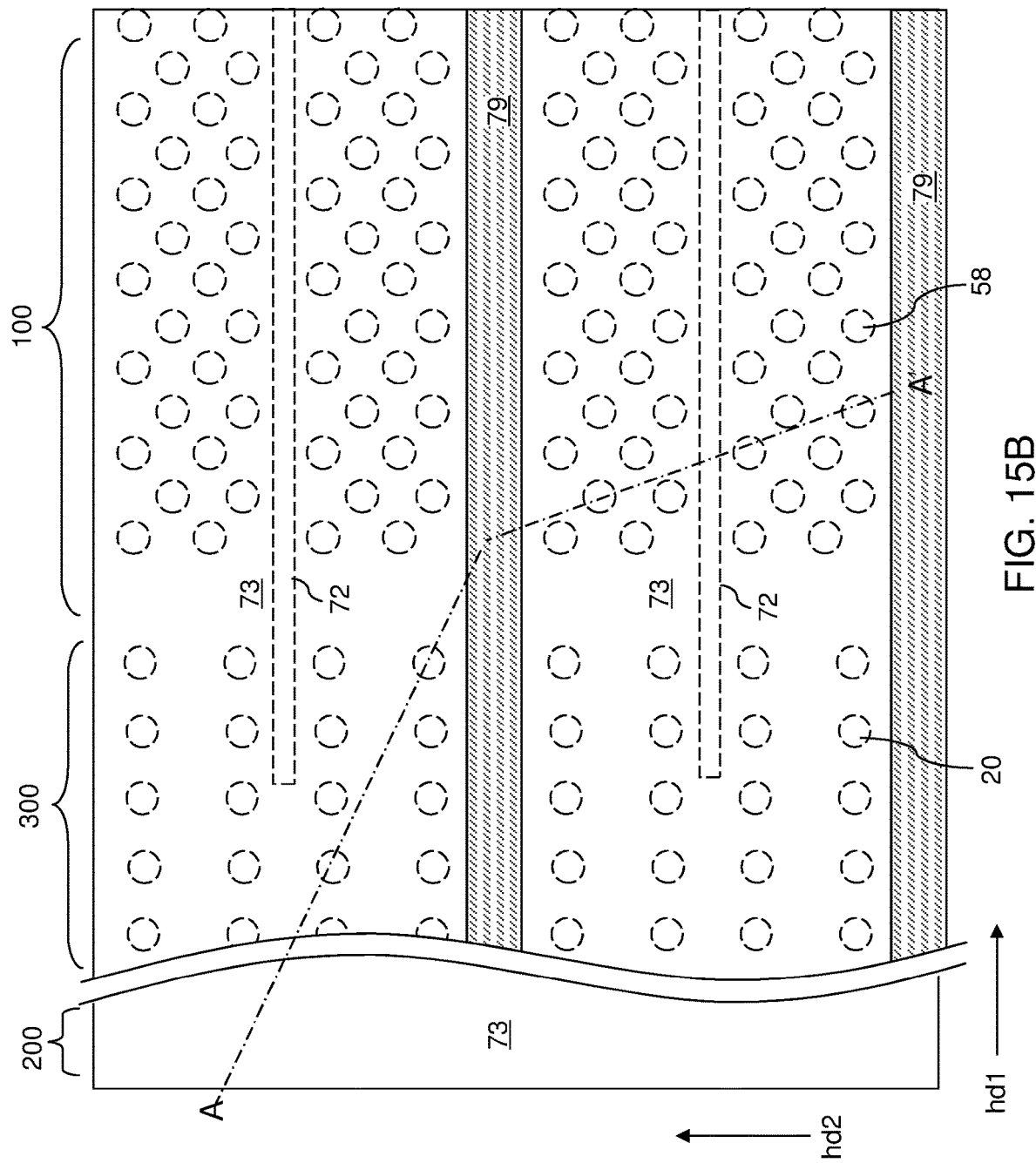

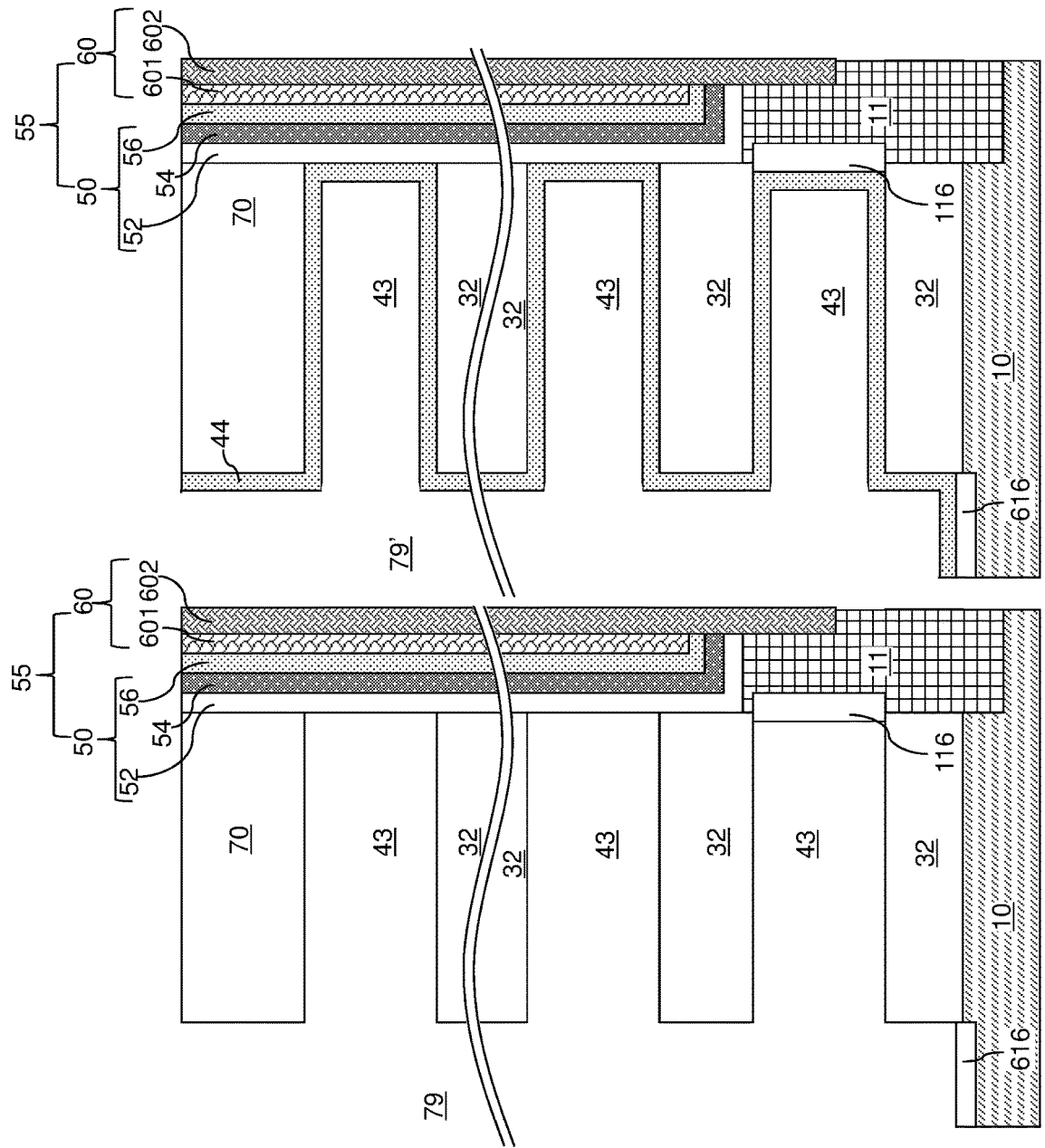

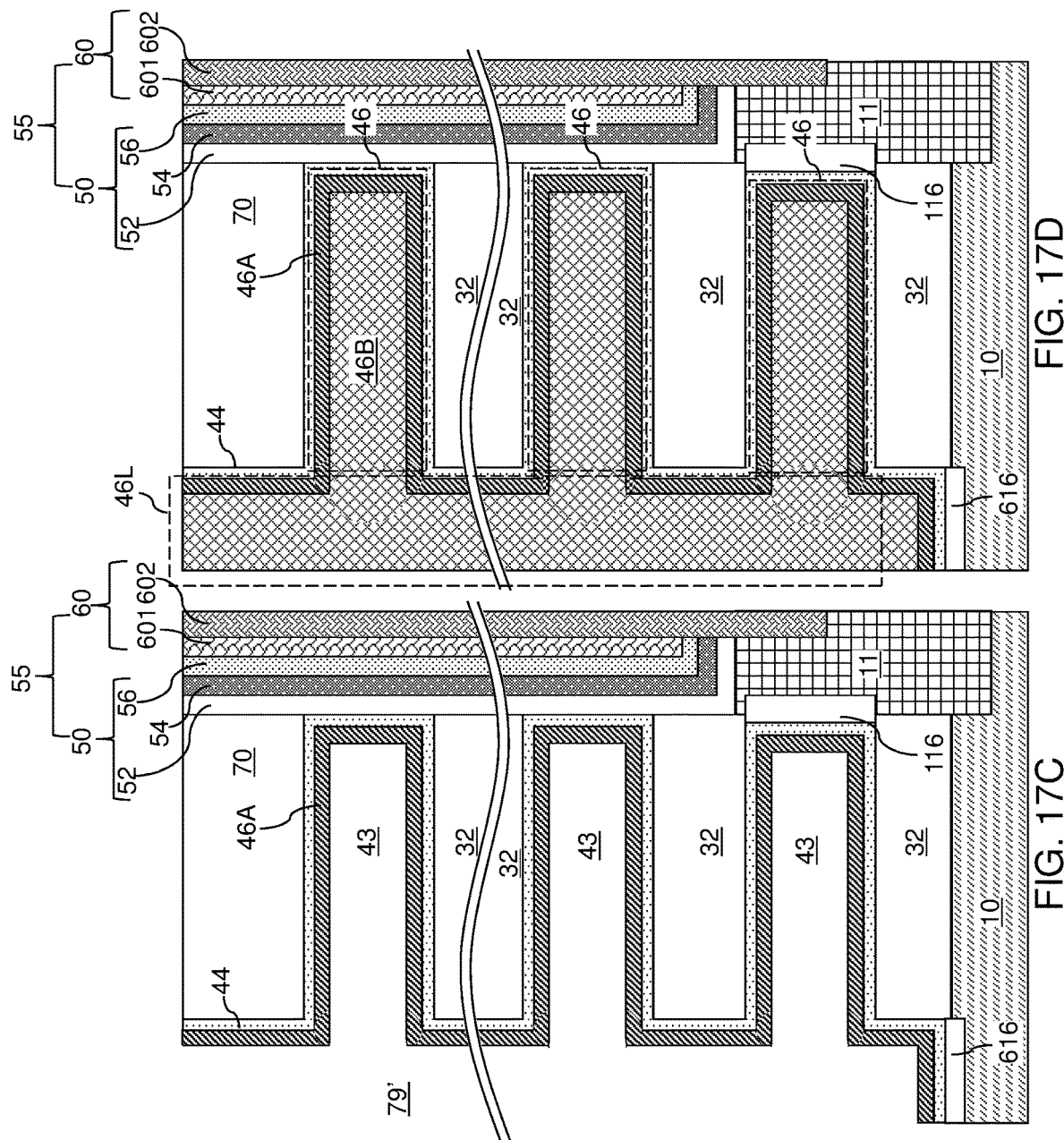

US 10,700,089 B1

THREE-DIMENSIONAL MEMORY DEVICE INCLUDING LOCALLY THICKENED ELECTRICALLY CONDUCTIVE LAYERS AND METHODS OF MANUFACTURING THE SAME

FIELD

The present disclosure relates generally to the field of semiconductor devices, and particular to a three-dimensional memory device including locally thickened electrically conductive layers and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate; memory stack structures extending through the alternating stack, wherein each of the memory stack structures comprises a memory film and a vertical semiconductor channel; and a staircase region including stepped surfaces of the alternating stack, wherein the electrically conductive layers have lateral extents that decrease with a vertical distance from the substrate within the staircase region, wherein a first electrically conductive layer among the electrically conductive layers has a first thickness in a first area that underlies an overlying one of the insulating layers of the alternating stack, a second thickness in a distal segment of a second area that laterally protrudes farther than the overlying one of the insulating layers of the alternating stack, and a third thickness in a proximal segment of the second area located between the distal segment of the second area and the first area, wherein the second thickness is greater than the first thickness, and the third thickness is different from the second thickness.

According to another aspect of the present disclosure, a method of forming a three-dimensional memory device is provided, which comprises: forming an alternating stack of insulating layers and sacrificial material layers over a substrate; forming dielectric pillar structures through the alternating stack; forming stepped surfaces by patterning the alternating stack in a staircase region, wherein the sacrificial material layers have lateral extents that decrease with a vertical distance from the substrate in the staircase region; vertically recessing top surfaces of the dielectric pillar structures below the stepped surfaces to form recess cavities; forming sacrificial pads by depositing a sacrificial pad material in the recess cavities and over the stepped surfaces; forming a retro-stepped dielectric material portion over the sacrificial pads; forming memory stack structures extending through the alternating stack, wherein each of the memory stack structures comprises a memory film and a vertical semiconductor channel; and replacing the sacrificial material layers and the sacrificial pads with replacement material portions that comprise electrically conductive layers.

BRIEF DESCRIPTION OF THE DRAWINGS

FIG. 3A is a schematic vertical cross-sectional view of the first exemplary structure after formation of support openings and drain-select-level trenches according to the first embodiment of the present disclosure.

FIG. 6B is a top-down view of the first exemplary structure of FIG. 6A. The vertical plane A-A' is the plane of the cross-section for FIG. 6A.

FIG. 12A is a schematic vertical cross-sectional view of the first exemplary structure after formation of memory openings according to the first embodiment of the present disclosure.

FIG. 12B is a top-down view of the first exemplary structure of FIG. 12A. The vertical plane A-A' is the plane of the cross-section for FIG. 12A.

FIGS. 13A-13H are sequential schematic vertical cross-sectional views of a memory opening within the first exemplary structure during formation of a memory stack structure, an optional dielectric core, and a drain region therein according to the first embodiment of the present disclosure.

FIG. 15B is a partial see-through top-down view of the first exemplary structure of FIG. 15A. The vertical plane A-A' is the plane of the schematic vertical cross-sectional view of FIG. 15A.

FIGS. 17A-17E are sequential vertical cross-sectional views of a region of the first exemplary structure during formation of electrically conductive layers according to the first embodiment of the present disclosure.

DETAILED DESCRIPTION

Figure 1:
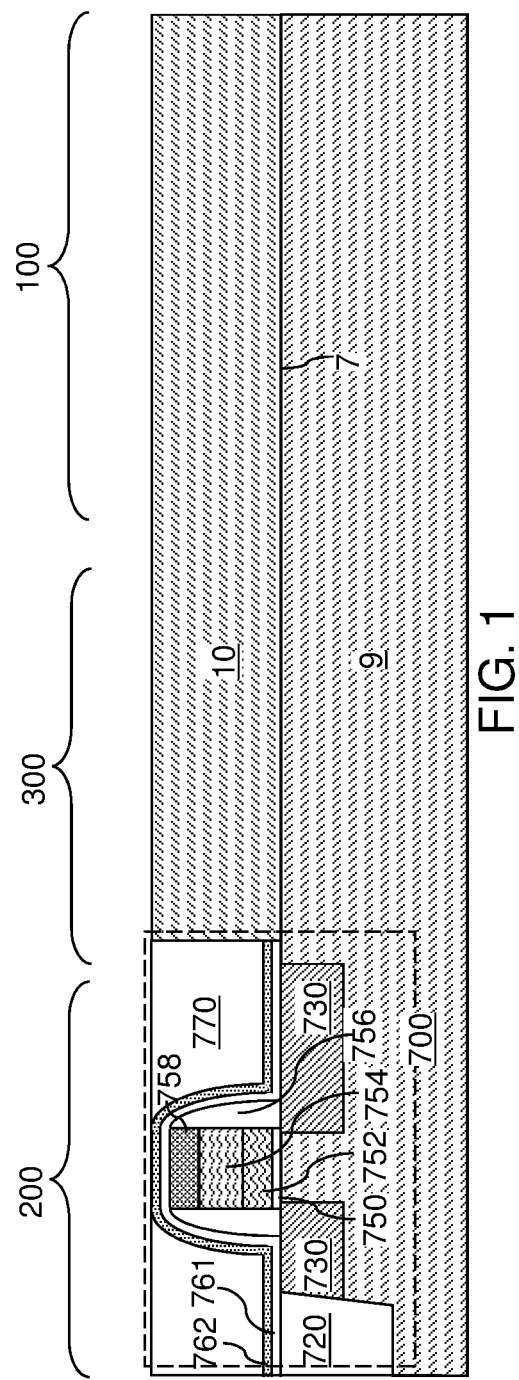
FIG. 1 is a schematic vertical cross-sectional view of a first exemplary structure after formation of at least one peripheral device, and a semiconductor material layer according to a first embodiment of the present disclosure.

As discussed above, various embodiments of the present disclosure are directed to three-dimensional memory devices including a vertical stack of multilevel memory arrays and methods of making thereof, the various aspects of which are described below. Various embodiments of the disclosure can be used to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. Three-dimensional memory devices according to various embodiments of the present disclosure include a monolithic three-dimensional NAND string memory device, and can be fabricated using the various embodiments described herein.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many external commands as the total number of planes therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming. A page is also the smallest unit that can be selected to a read operation.

Referring to FIG. 1, a first exemplary structure according to a first embodiment of the present disclosure is illustrated, which can be used, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from $1.0$ S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants using the at least one gate structure (750, 752, 754, 758) as masking structures. Additional masks may be used as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be used for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers can be provided between the memory array region 100 and the peripheral device region 200.

Figure 2:
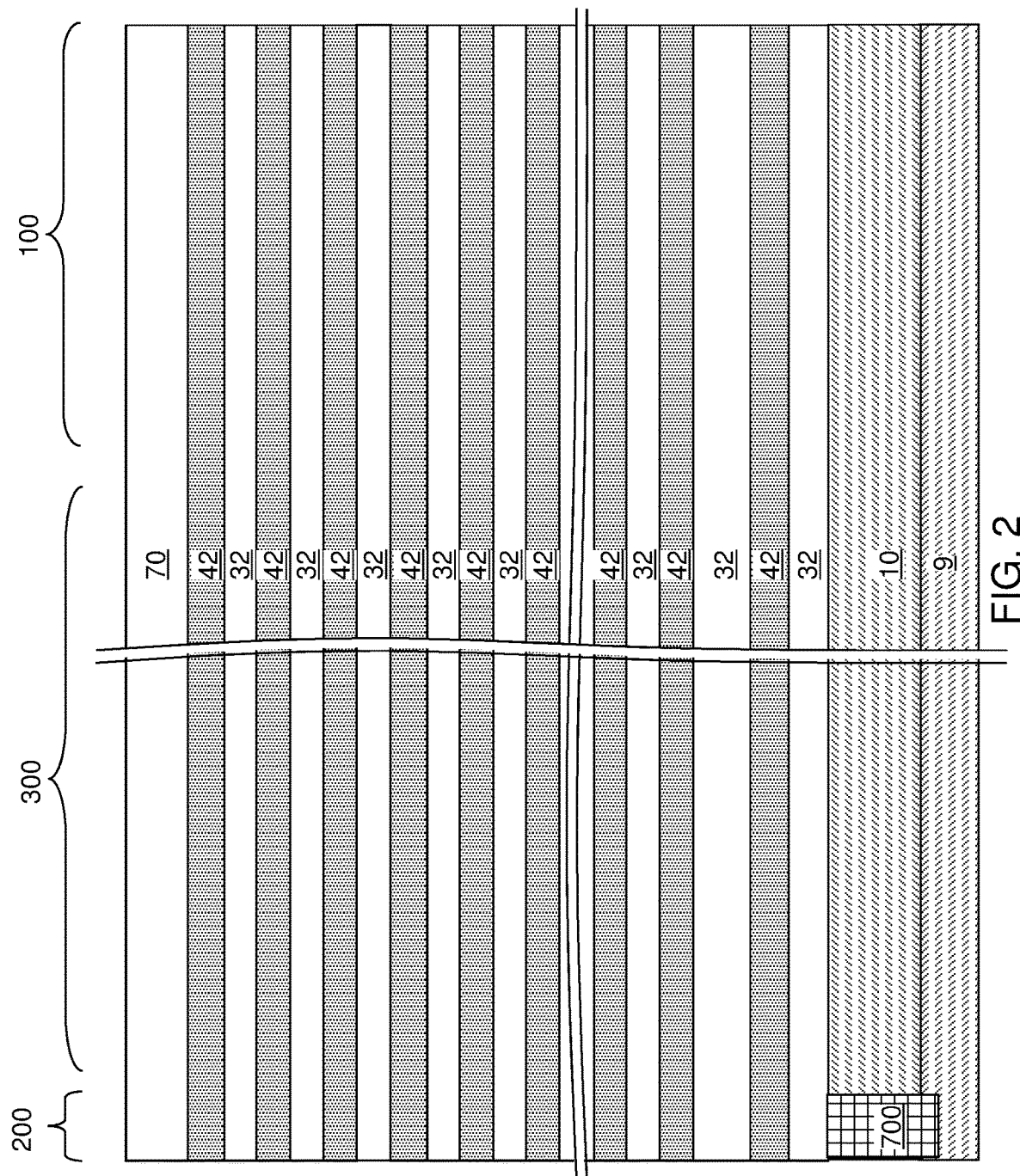
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality of insulating layers 32 and sacrificial material layers 42 is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is used for the insulating layers 32, tetraethyl orthosilicate (TEOS) can be used as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be used for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be used. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described using an embodiment in which the spacer material layers are sacrificial material layers 42 that are subsequently replaced with electrically conductive layers, in other embodiments the sacrificial material layers are formed as electrically conductive layers, in which case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be used for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3B:
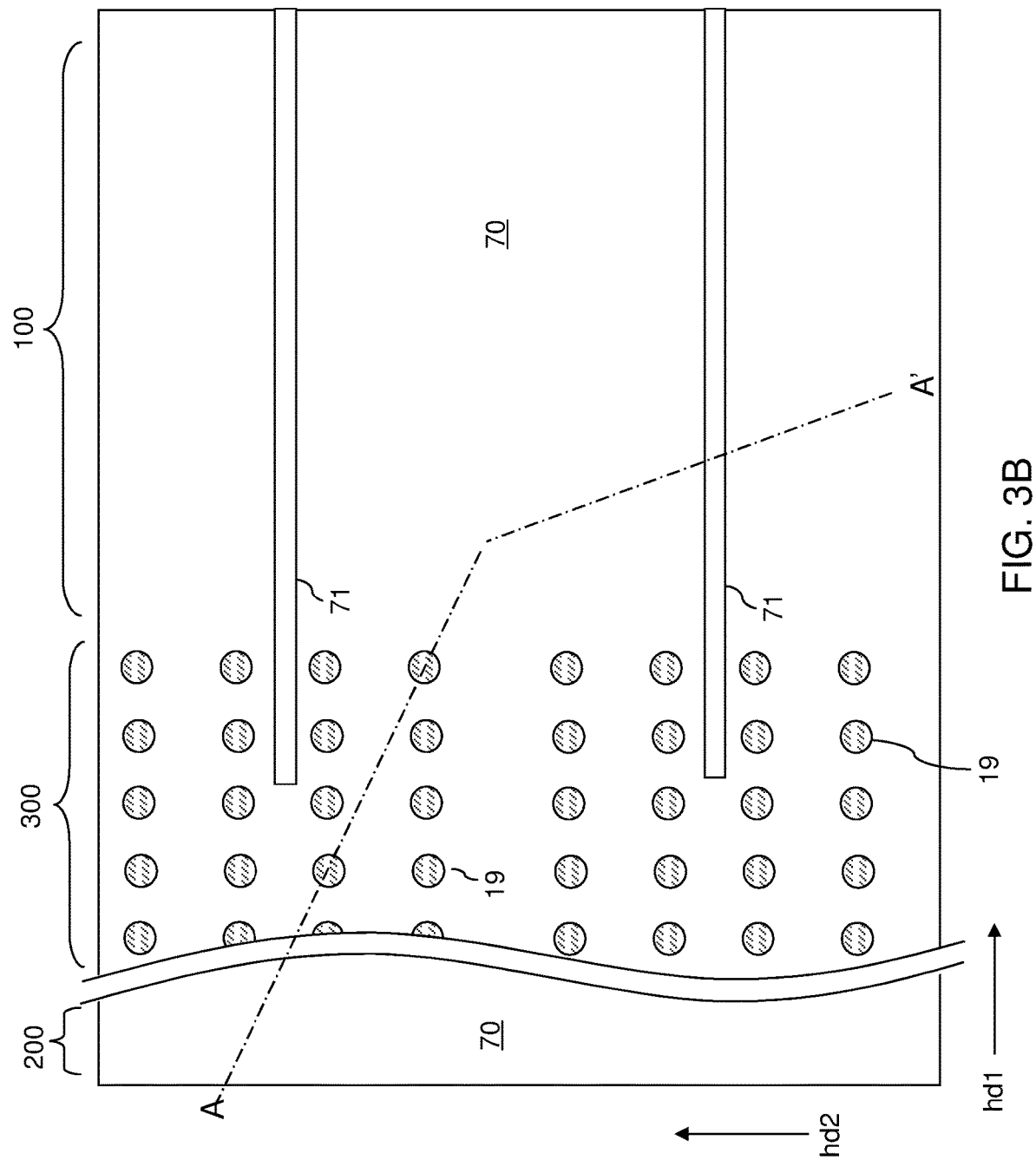
FIG. 3B is a top-down view of the first exemplary structure of FIG. 3A. The vertical plane A-A' is the plane of the cross-section for FIG. 3A.

Referring to FIGS. 3A and 3B, discrete openings are formed in the staircase region 300. For example, a photoresist layer can be applied over the insulating cap layer 70, and is lithographically patterned to form an array of openings in the staircase region 300. An anisotropic etch is performed to transfer the pattern of the openings in the photoresist layer through the insulating cap layer 70 and the alternating stack (32, 42) into an upper portion of the semiconductor material layer 10. Support openings 19 are formed through the alternating stack (32, 42). The photoresist layer can be subsequently removed, for example, by ashing.

Optionally, another photoresist layer can be applied over the insulating cap layer 70, and can be lithographically patterned to form a pattern of elongated openings that laterally extend along a first horizontal direction hd1 in the memory array region 100 and in a proximal portion of the staircase region 300. An anisotropic etch process is performed to transfer the pattern of the elongated openings through drain-select-level layers of the alternating stack (32, 42) in which drain-select-level electrically conductive layers are to be subsequently formed. Drain-select-level isolation trenches 71 are formed, which laterally extend along the first horizontal direction hd1 and are laterally spaced apart along a second horizontal direction hd2.

Figure 4:
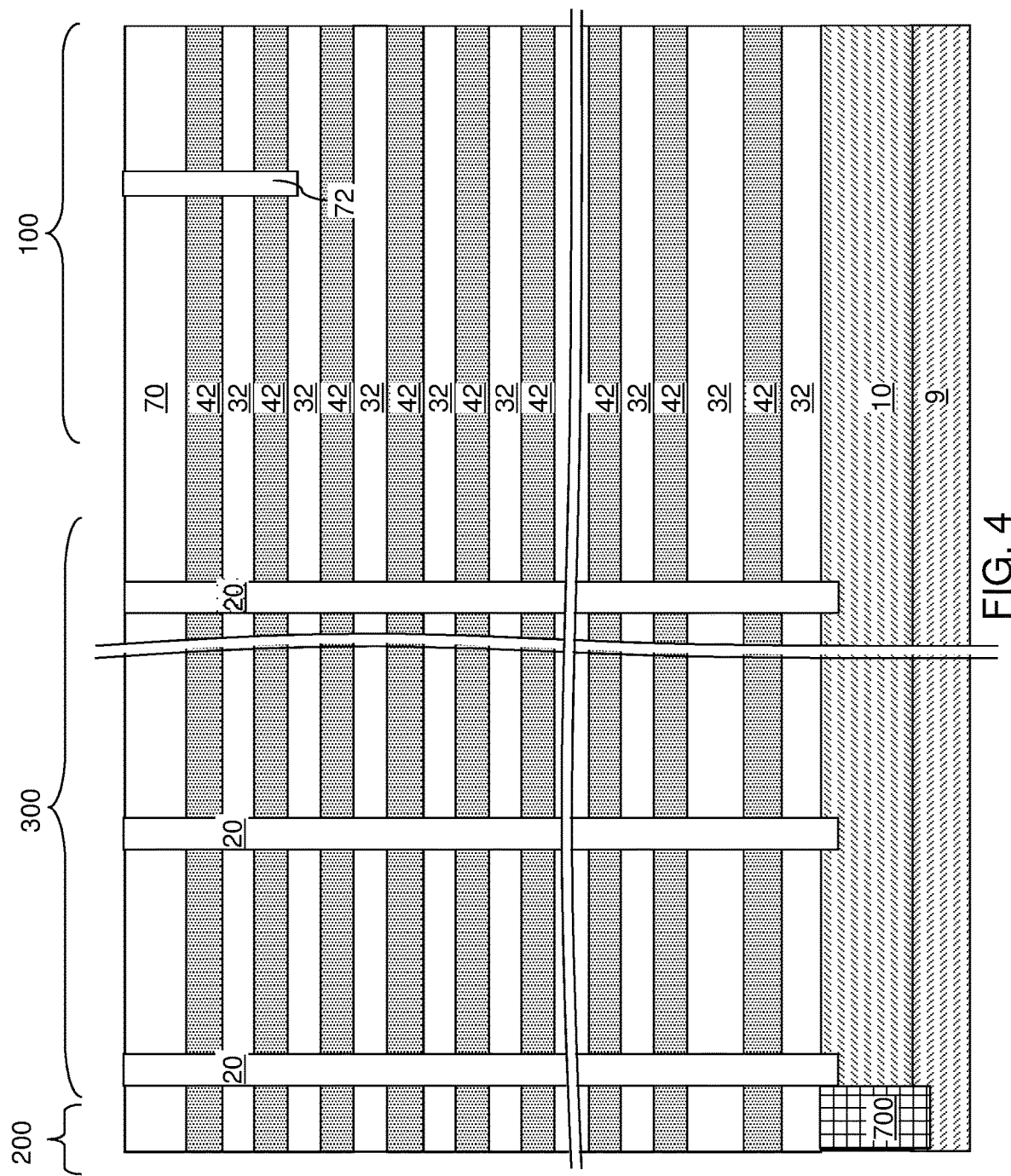
FIG. 4 is a schematic vertical cross-sectional view of the first exemplary structure after formation of dielectric pillar structures and drain-select-level isolation structures according to the first embodiment of the present disclosure.

Referring to FIG. 4, a dielectric material, such as undoped silicate glass or a doped silicate glass, is deposited in the support openings 19 and the drain-select-level isolation trenches 71. Dielectric pillar structures 20 are formed in the support openings 19, and drain-select-level isolation structures 72 are formed in the drain-select-level isolation trenches 71.

Figure 5:
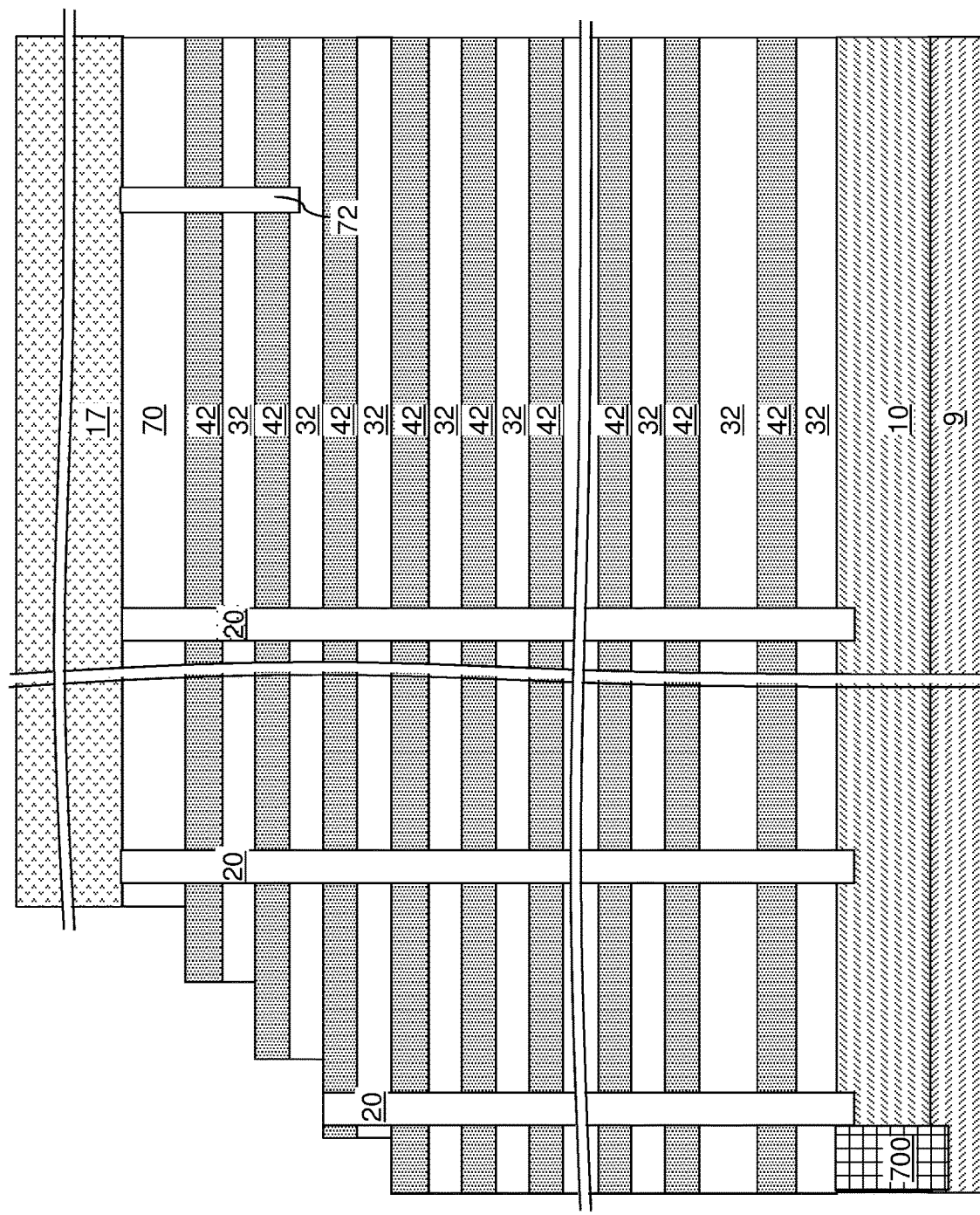
FIG. 5 is a schematic vertical cross-sectional view of the first exemplary structure after during formation of stepped surfaces according to the first embodiment of the present disclosure.

Referring to FIG. 5, stepped surfaces are formed in the staircase region 300. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface.

The stepped surfaces can be formed, for example, by applying a trimmable mask layer 17 (such as an amorphous carbon-based material layer) that provides a controlled ashing rate over the insulating cap layer 70, by lithographically forming an opening in the trimmable mask layer 17 in a distal portion of the staircase region 300 that is spaced from the memory array region 100, by performing a first anisotropic etch process that transfers the pattern in the trimmable mask layer 17 through the insulating cap layer 70 by etching the material of the insulating cap layer 70 selective to the material of the sacrificial material layers 42, and by iteratively performing a combination of a trimming process and an anisotropic etch process. Each trimming process isotropically trims the trimmable mask layer 17 by a step width, and each anisotropic etch process includes a first anisotropic etch step that etches physically exposed portions of the sacrificial material layers 42 selective to the material of the insulating layers 32 and a second anisotropic etch step that etches physically exposed portions of the insulating cap layer 70 and the insulating layers 32 selective to the material of the sacrificial material layers 42. FIG. 5 illustrates the first exemplary structure after repeating the combination of the trimming process and the anisotropic etch process three times. Physically exposed portions of the dielectric pillar structures 20 are collaterally etched during the anisotropic etch steps. In one embodiment, the insulating layers 32 and the insulating cap layer 70 can include undoped silicate glass, and the dielectric pillar structures 20 can include a doped silicate glass that provides a higher etch rate than the undoped silicate glass during the second anisotropic etch steps. The composition of the doped silicate glass may be selected to provide an etch rate for the material of the dielectric pillar structures 20 that is about twice the etch rate for the material of the insulating layers 32 during the second anisotropic etch steps.

Figure 6A:
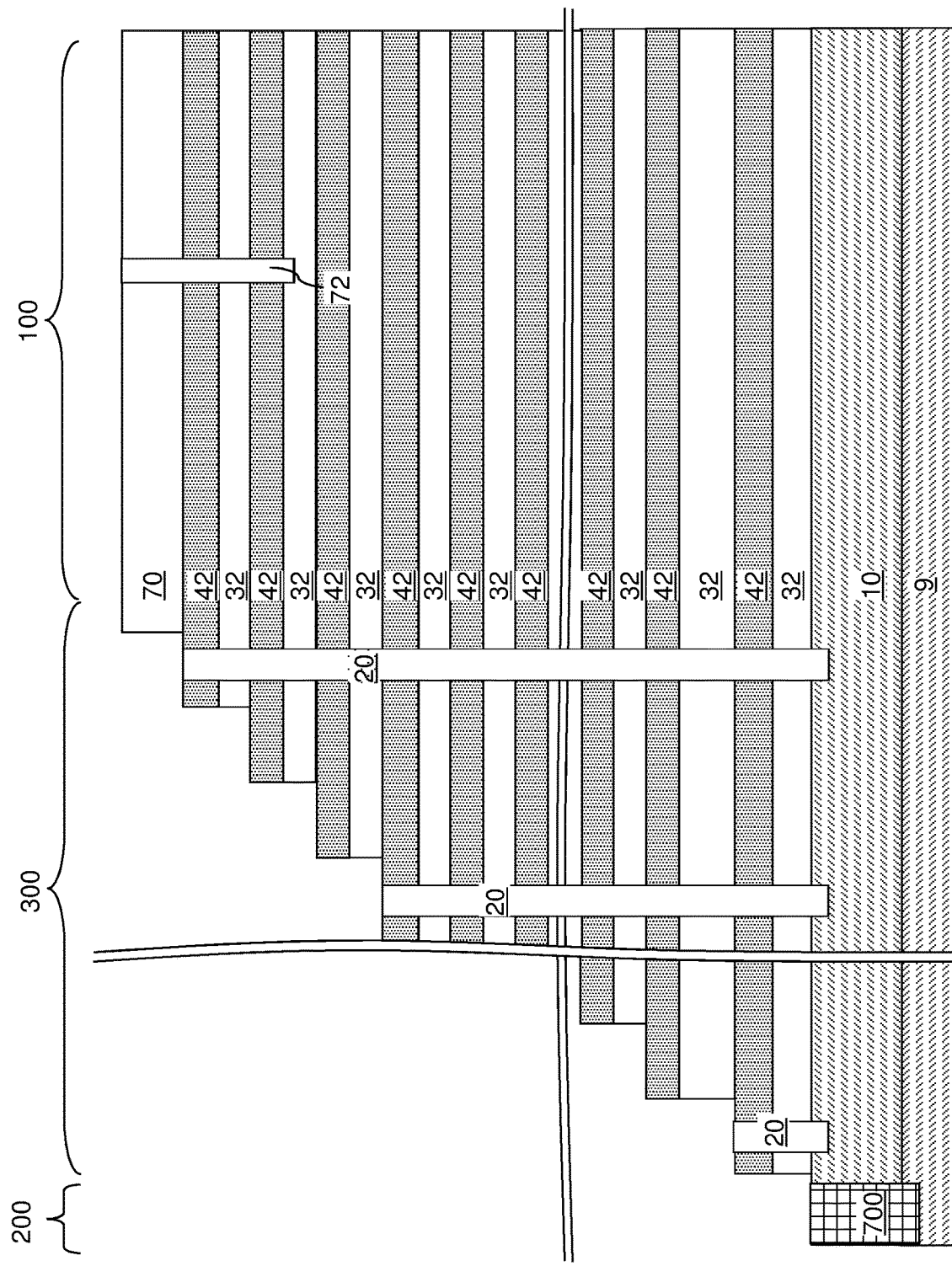
FIG. 6A is a schematic vertical cross-sectional view of the first exemplary structure after formation of stepped surfaces according to the first embodiment of the present disclosure.

Referring to FIGS. 6A and 6B, the combination of the trimming process and the anisotropic etch process can be repeated until the bottommost insulating layer 32 of the alternating stack (32, 42) is etched through and a top surface of the semiconductor material layer 10 is physically exposed. A stepped cavity is formed within the volume from which portions of the alternating stack (32, 42) are removed through formation of the stepped surfaces. A "stepped cavity" refers to a cavity having stepped surfaces.

The stepped surfaces may be formed between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). Each sacrificial material layer 42 other than a topmost sacrificial material layer 42 within the alternating stack (32, 42) laterally extends farther than any overlying sacrificial material layer 42 within the alternating stack (32, 42) in the staircase region 300. The stepped surfaces of the alternating stack (32, 42) may continuously extend from a bottommost layer within the alternating stack (32, 42) to a topmost layer within the alternating stack (32, 42).

Generally, the sacrificial material layers 42 have lateral extents that decrease with a vertical distance from the substrate in the staircase region 300. The top surface of each dielectric pillar structure 20 can be located within the horizontal surface of a topmost one of the sacrificial material layers 42 through which the dielectric pillar structure 20 extends. Alternatively, the top surface of each dielectric pillar structure 20 may protrude above, or may be recessed below, the horizontal surface of a topmost one of the sacrificial material layers 42 through which the dielectric pillar structure 20 extends.

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations using three, four, or more columns of staircases with a respective set of vertical offsets among the physically exposed surfaces of the sacrificial material layers 42 may also be used. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

Figure 7:
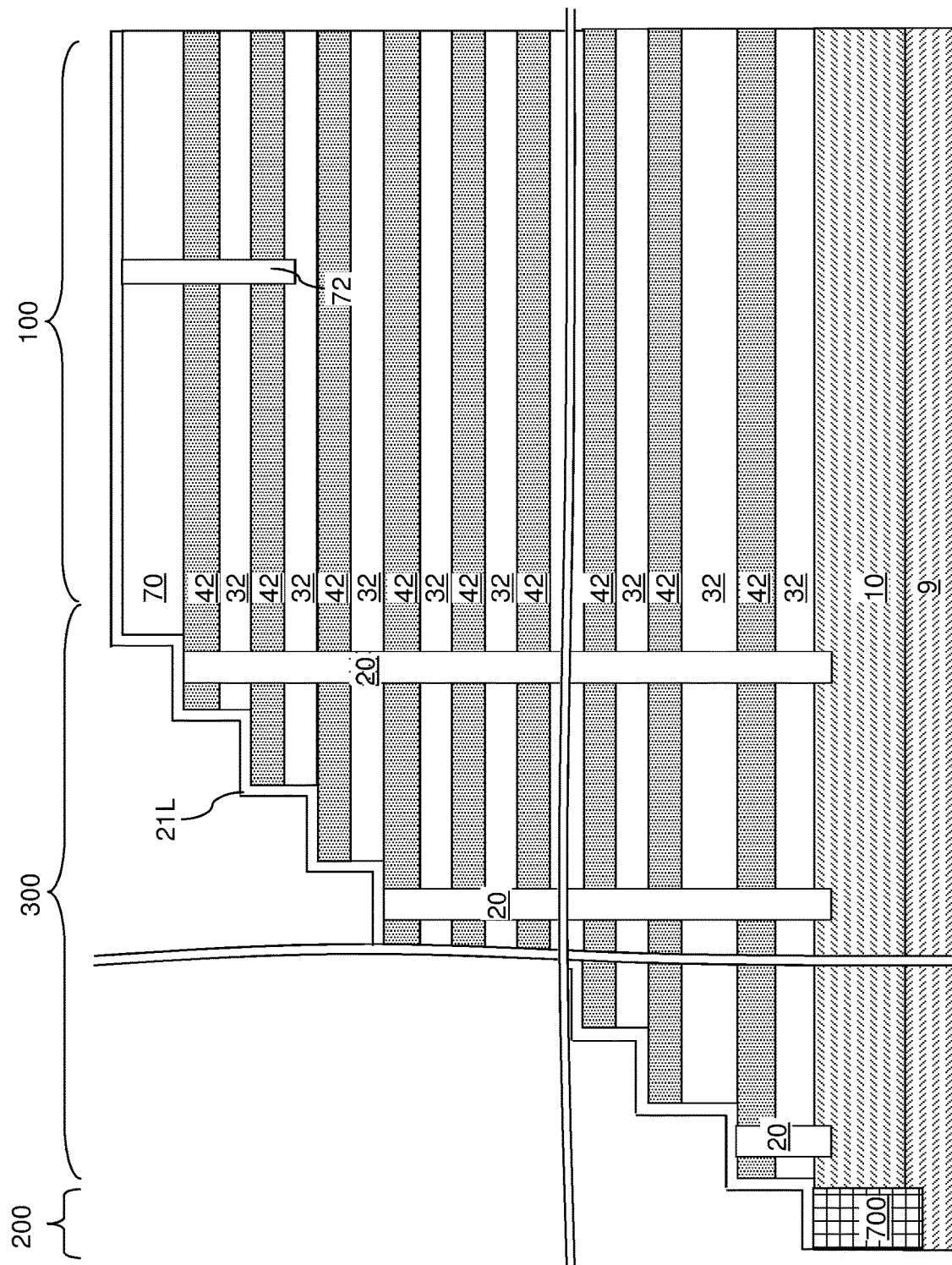
FIG. 7 is a schematic vertical cross-sectional view of the first exemplary structure after deposition of a conformal insulating material layer over the stepped surfaces according to the first embodiment of the present disclosure.

Referring to FIG. 7, a conformal insulating material layer 21L is formed on the stepped surfaces of the alternating stack (32, 52) and over the insulating cap layer 70. The conformal insulating material layer 21L includes a dielectric material such as undoped silicate glass, a doped silicate glass, or organosilicate glass. The conformal insulating material layer 21L can have a thickness in a range from 4 nm to 20 nm, although lesser and greater thicknesses can also be used. In one embodiment, the conformal insulating material layer 21L can have a thickness in a range from 20% to 60% of the average thickness of the insulating layers 32.

Figure 8:
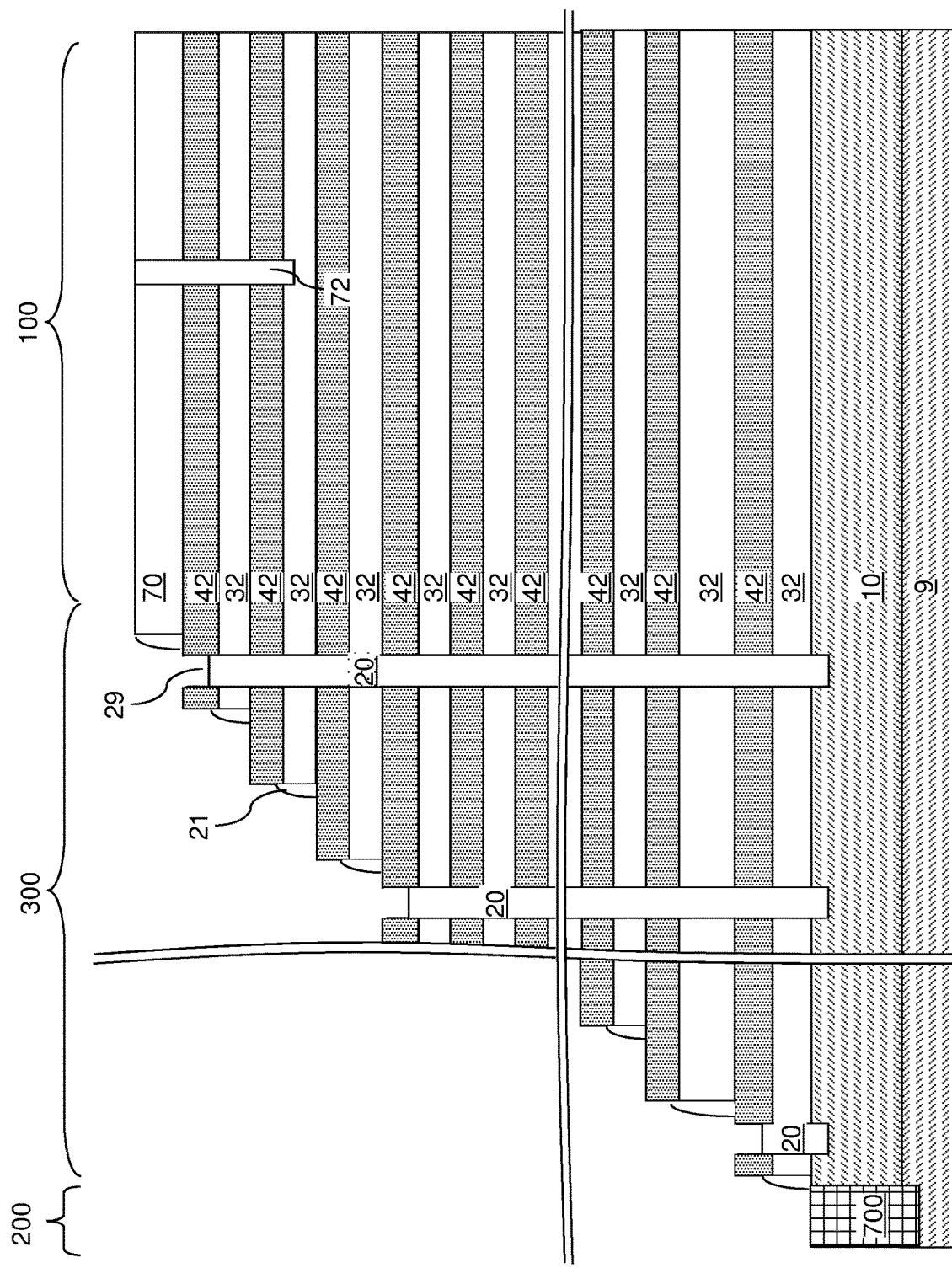
FIG. 8 is a schematic vertical cross-sectional view of the first exemplary structure after formation of insulating spacers and recess cavities according to the first embodiment of the present disclosure.

Referring to FIG. 8, an anisotropic etch process is performed to remove horizontal portions of the conformal insulating material layer 21L. The anisotropic etch process can be selective to the material of the sacrificial material layers 42. Each remaining portion of the conformal insulating material layer 21L located on sidewalls of the insulating layers 32 constitute insulating spacers 21. In one embodiment, the insulating layers 32 and the conformal insulating material layer 21L can include materials selected from undoped silicate glass, doped silicate glasses, or organosilicate glass, and the anisotropic etch process can etch the materials of the insulating layers 32 and the conformal insulating material layer 21L selective to the material of the sacrificial material layers 42. The anisotropic etch process can be continued to recess top surfaces of the dielectric pillar structures 20 below horizontal surfaces within the stepped surfaces without etching, or with only insignificant etching, of the sacrificial material layers 42. Recess cavities 29 are formed above each recessed top surface of the dielectric pillar structures 20. The depth of each recess cavity 29 can be in a range from 3% to 150%, such as from 10% to 80%, of the thickness of the sacrificial material layer 42 that laterally surrounds the recess cavity 29.

Figure 9:
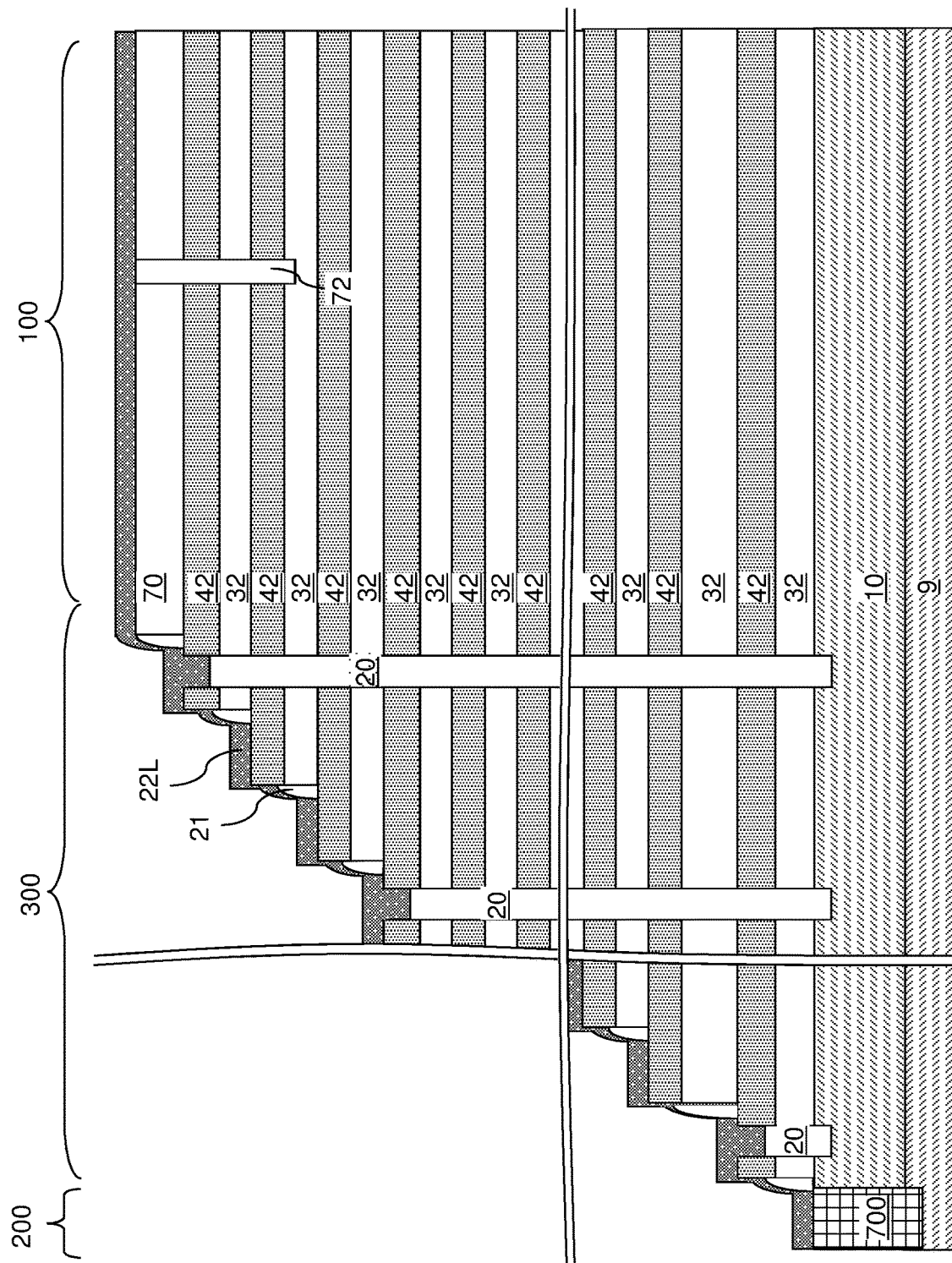
FIG. 9 is a schematic vertical cross-sectional view of the first exemplary structure after anisotropic deposition of a sacrificial pad material according to the first embodiment of the present disclosure.

Referring to FIG. 9, a sacrificial pad material layer 22L is anisotropically deposited. The sacrificial pad material layer 22L includes a sacrificial pad material, which may be the same as the material of the sacrificial material layers 42. For example, the sacrificial material layers 42 can include silicon nitride, and the sacrificial pad material layer 22L can include silicon nitride. In one embodiment, the sacrificial pad material layer 22L can be deposited by plasma enhanced chemical vapor deposition (PECVD) process. The sacrificial pad material can be anisotropically deposited in the recess cavities 29, physically exposed horizontal surfaces of the sacrificial material layers 42, and on outer sidewalls of the insulating spacers 21. The duration of the deposition process that deposits the sacrificial pad material layer 22L can be selected such that each recess cavity 29 is filled with a respective portion of the sacrificial pad material layer 22L.

Figure 10:
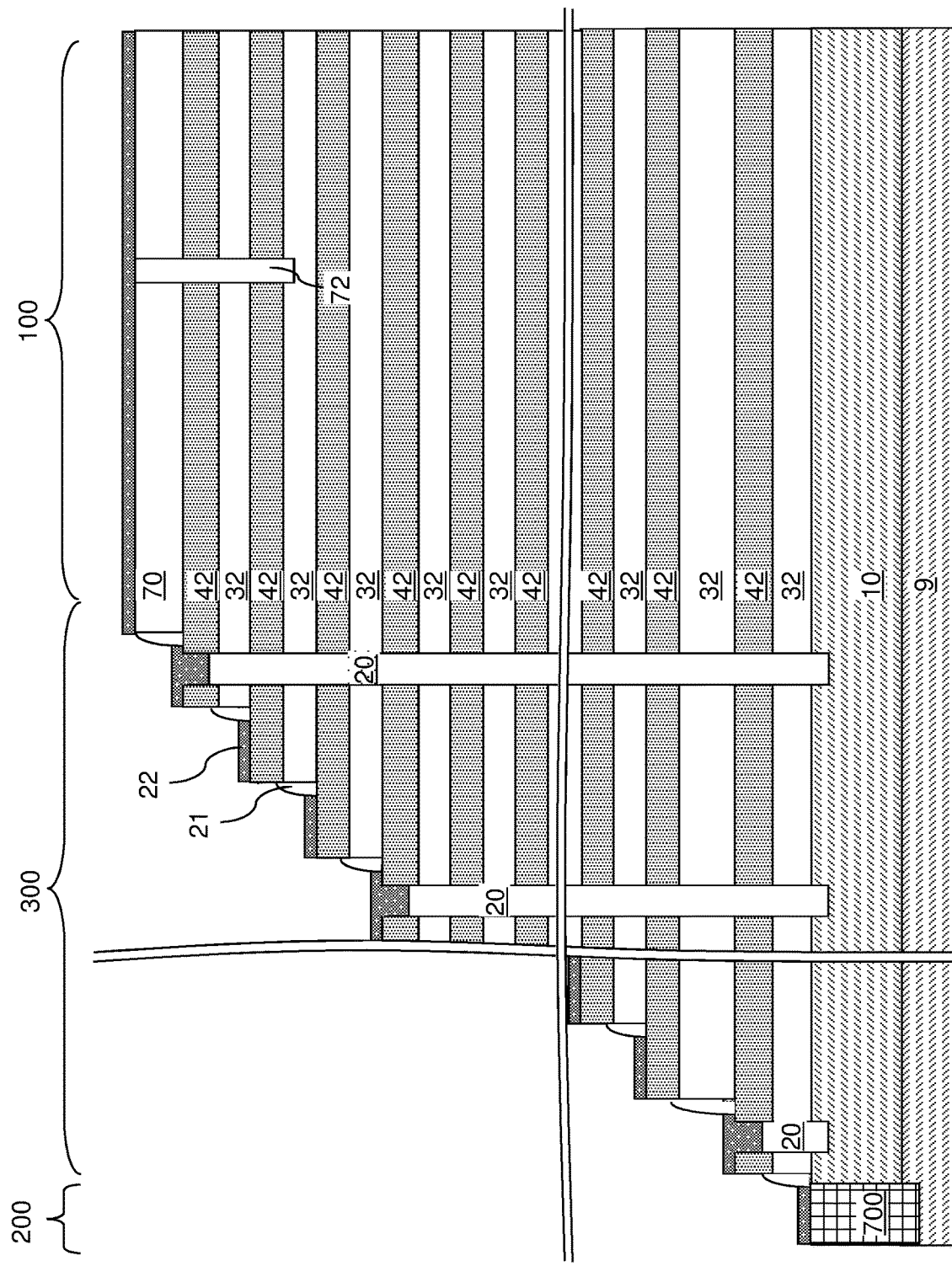
FIG. 10 is a schematic vertical cross-sectional view of the first exemplary structure after formation of sacrificial pads according to the first embodiment of the present disclosure.

Referring to FIG. 10, the sacrificial pad material can be isotropically recessed by performing an isotropic etch process. The isotropic etch process etches the sacrificial pad material selective to the materials of the insulating spacers 21. For example, if the sacrificial pad material includes silicon nitride and if the insulating layers 32 include silicon oxide, the isotropic etch process can include a wet etch process using hot phosphoric acid. Remaining portions of the sacrificial pad material after the isotropic etch process constitute include sacrificial pads 22 that are formed on horizontal surfaces of the sacrificial material layers 42.

Figure 11:
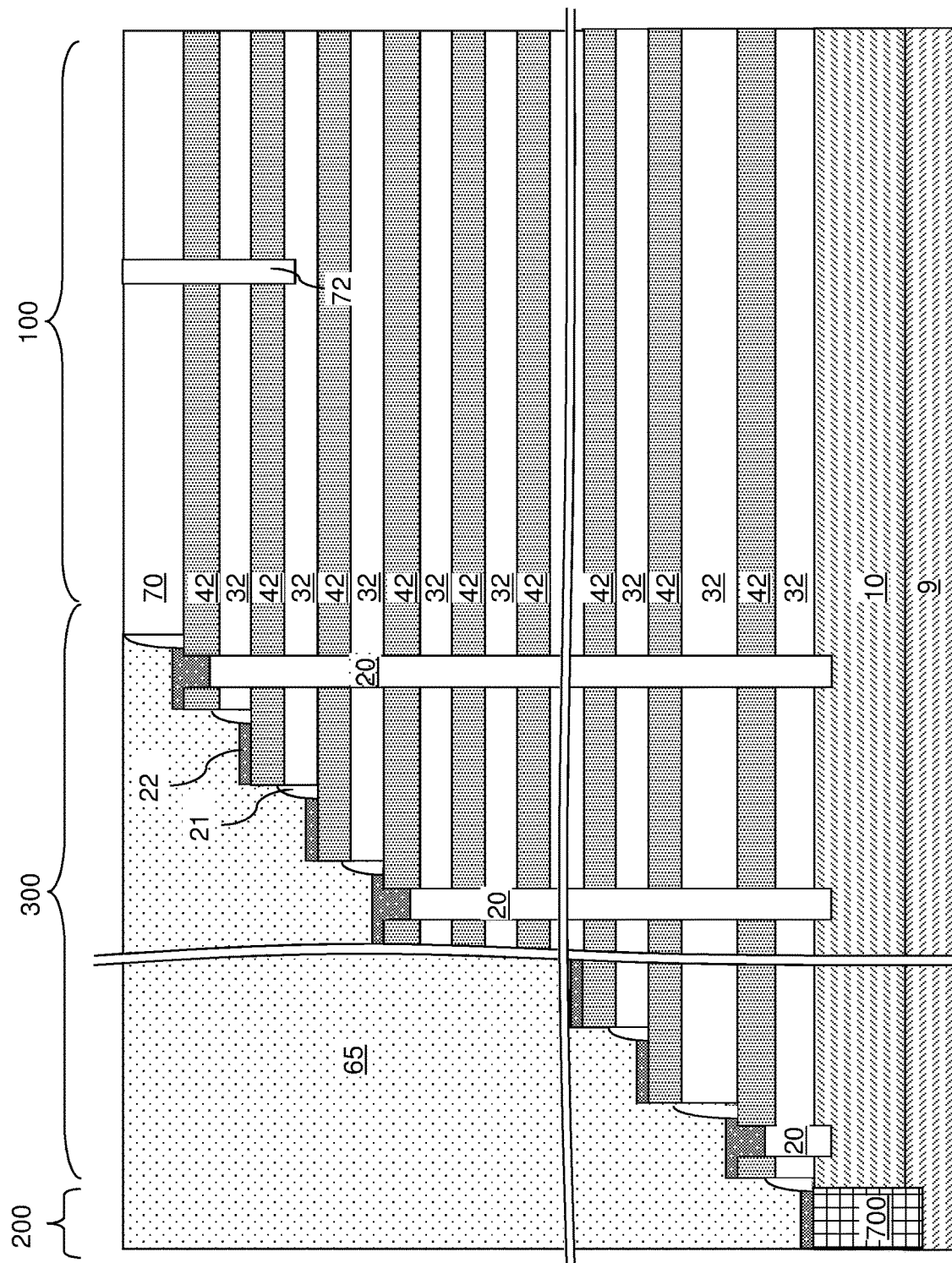
FIG. 11 is a schematic vertical cross-sectional view of the first exemplary structure after formation of a retro-stepped dielectric material portion according to the first embodiment of the present disclosure.

Referring to FIG. 11, a retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F. The retro-stepped dielectric material portion 65 is formed over, and on, the sacrificial pads 22 and the insulating spacers 21. A portion of the sacrificial pad material overlying the insulating cap layer 70 can be removed during, or after, formation of the retro-stepped dielectric material portion 65. For example, the portion of the sacrificial pad material overlying the insulating cap layer 70 can be used as a planarization stopping layer and can be removed after the planarization process.

Referring to FIGS. 12A and 12B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the retro-stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack are etched to form memory openings 49. As used herein, a "memory opening" refers to a structure in which memory elements, such as a memory stack structure, is subsequently formed. The memory openings 49 are formed through the insulating cap layer 70 and the entirety of the alternating stack (32, 42) in the memory array region 100.

The memory openings 49 extend through the entirety of the alternating stack (32, 42). The chemistry of the anisotropic etch process used to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 can be substantially vertical, or can be tapered. The patterned lithographic material stack can be subsequently removed, for example, by ashing.

The memory openings 49 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be used. The overetch is optional, and may be omitted. If the overetch is not performed, the bottom surfaces of the memory openings 49 can be coplanar with the topmost surface of the semiconductor material layer 10. Each of the memory openings 49 may include a sidewall (or a plurality of sidewalls) that extends substantially perpendicular to the topmost surface of the substrate. A two-dimensional array of memory openings 49 can be formed in the memory array region 100.

FIGS. 13A-13H illustrate structural changes in a memory opening 49, which is one of the memory openings 49 in the exemplary structure of FIGS. 12A and 12B. Referring to FIG. 13A, a memory opening 49 in the exemplary device structure of FIGS. 12A and 12B is illustrated. The memory opening 49 extends through the insulating cap layer 70, the alternating stack (32, 42), and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be used. Optionally, the sacrificial material layers 42 can be laterally recessed partially to form lateral recesses (not shown), for example, by an isotropic etch.

Referring to FIG. 13B, an optional pedestal channel portion (e.g., an epitaxial pedestal) 11 can be formed at the bottom portion of each memory opening 49, for example, by selective epitaxy. Each pedestal channel portion 11 comprises a single crystalline semiconductor material in epitaxial alignment with the single crystalline semiconductor material of the semiconductor material layer 10. In one embodiment, the top surface of each pedestal channel portion 11 can be formed above a horizontal plane including the top surface of a bottommost sacrificial material layer 42. In this case, a source select gate electrode can be subsequently formed by replacing the bottommost sacrificial material layer 42 with a conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 13C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide (HfO2), lanthanum oxide (LaO2), yttrium oxide (Y2O3), tantalum oxide (Ta2O5), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be used. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be used. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be used to form the charge storage layer 54 as a plurality of memory material portions that are vertically spaced apart. While the present disclosure is described using an embodiment in which the charge storage layer 54 is a single continuous layer, in other embodiments the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if used, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be used.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be used.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be used. A memory cavity 49' is formed in the volume of each memory opening 49 that is not filled with the deposited material layers (52, 54, 56, 601).

Referring to FIG. 13D, the optional first semiconductor channel layer 601, the tunneling dielectric layer 56, the charge storage layer 54, and the blocking dielectric layer 52 are sequentially anisotropically etched using at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process using a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not used) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not used) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (comprising the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 13E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be used. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 13F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 13G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can use a recess etch or chemical mechanical planarization (CMP). Each remaining portion of the second semiconductor channel layer 602 can be located entirety within a memory opening 49.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 13H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be used. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements comprising portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58.

Figure 14:
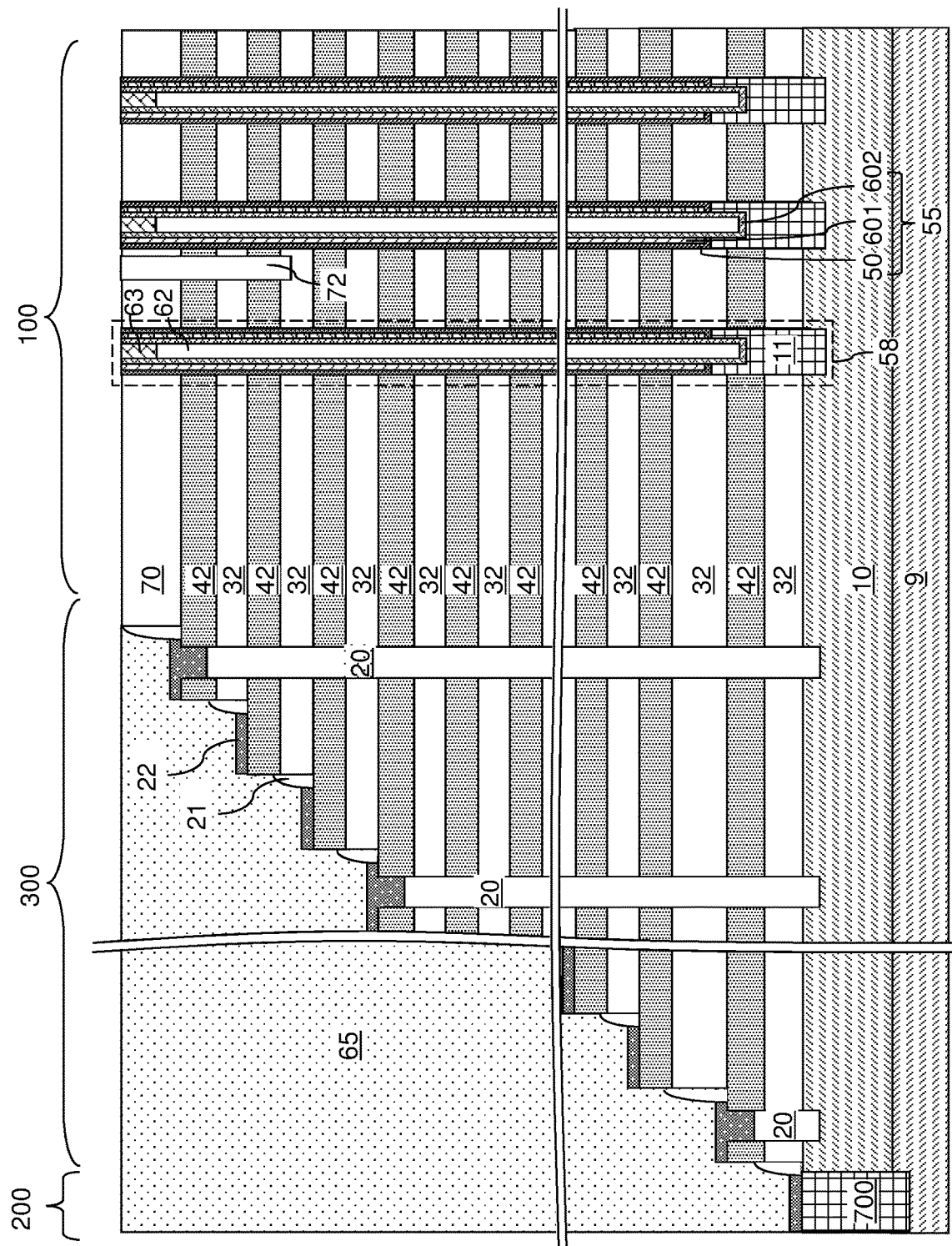
FIG. 14 is a schematic vertical cross-sectional view of the first exemplary structure after formation of memory stack structures according to the first embodiment of the present disclosure.

Referring to FIG. 14, the exemplary structure is illustrated after formation of memory opening fill structures 58 within the memory openings 49. An instance of a memory opening fill structure 58 can be formed within each memory opening 49 of the structure of FIGS. 12A and 12B. Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60, a vertical stack of charge storage regions (comprising a charge storage layer 54) laterally surrounding the tunneling dielectric layer 56, and an optional blocking dielectric layer 52. While the present disclosure is described using the illustrated configuration for the memory stack structure, the methods of various embodiments of the present disclosure can be applied to alternative memory stack structures including different layer stacks or structures for the memory film 50 and/or for the vertical semiconductor channel 60.

Figure 15A:
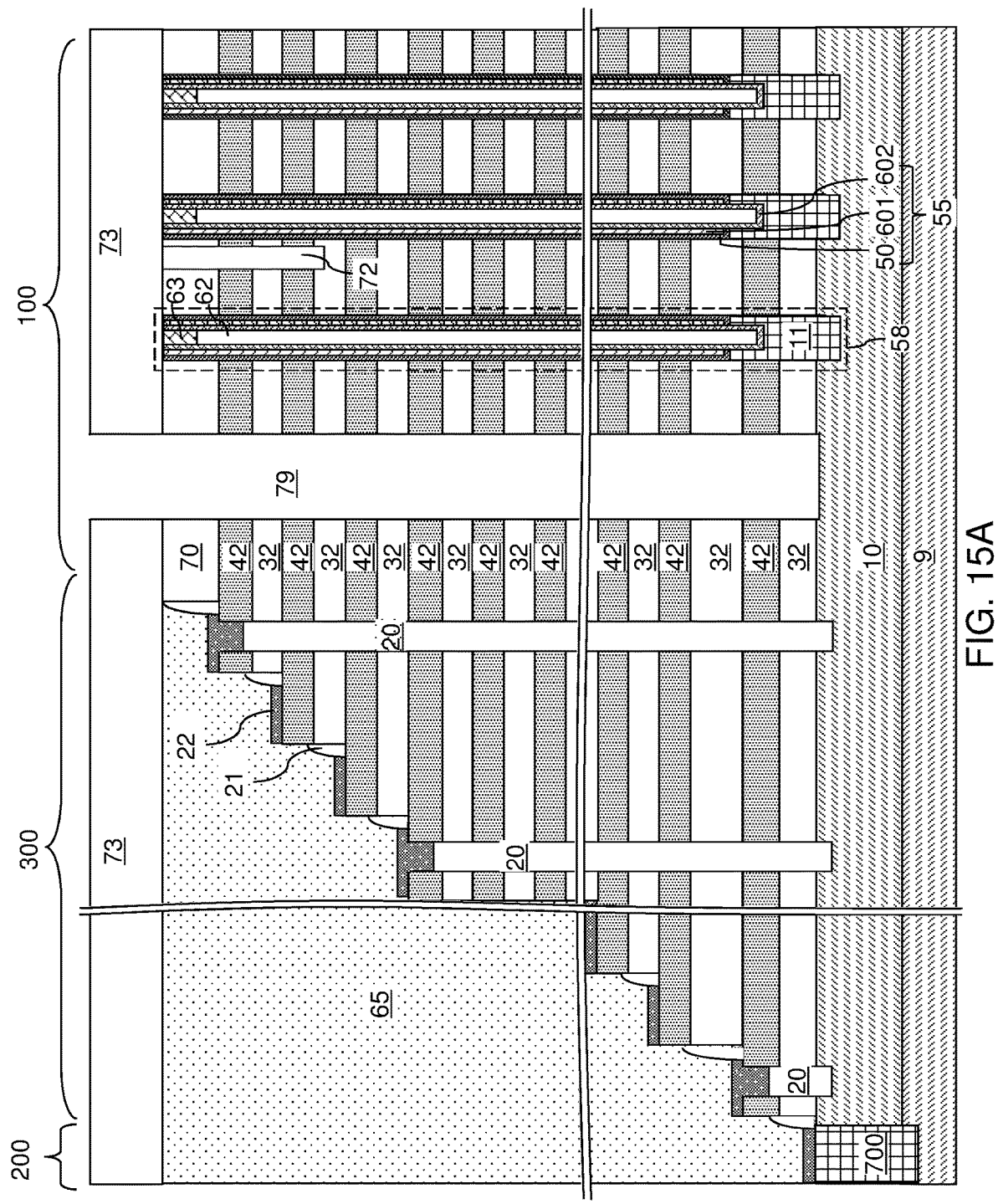
FIG. 15A is a schematic vertical cross-sectional view of the first exemplary structure after formation of backside trenches according to the first embodiment of the present disclosure.

Referring to FIGS. 15A and 15B, a contact level dielectric layer 73 can be formed over the alternating stack (32, 42) of insulating layer 32 and sacrificial material layers 42, and over the memory stack structures 55 and the dielectric pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be used.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 using an anisotropic etch to form backside trenches 79, which vertically extend from the top surface of the contact level dielectric layer 73 at least to the top surface of the substrate (9, 10), and laterally extend through the memory array region 100 and the staircase region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

Figure 16:
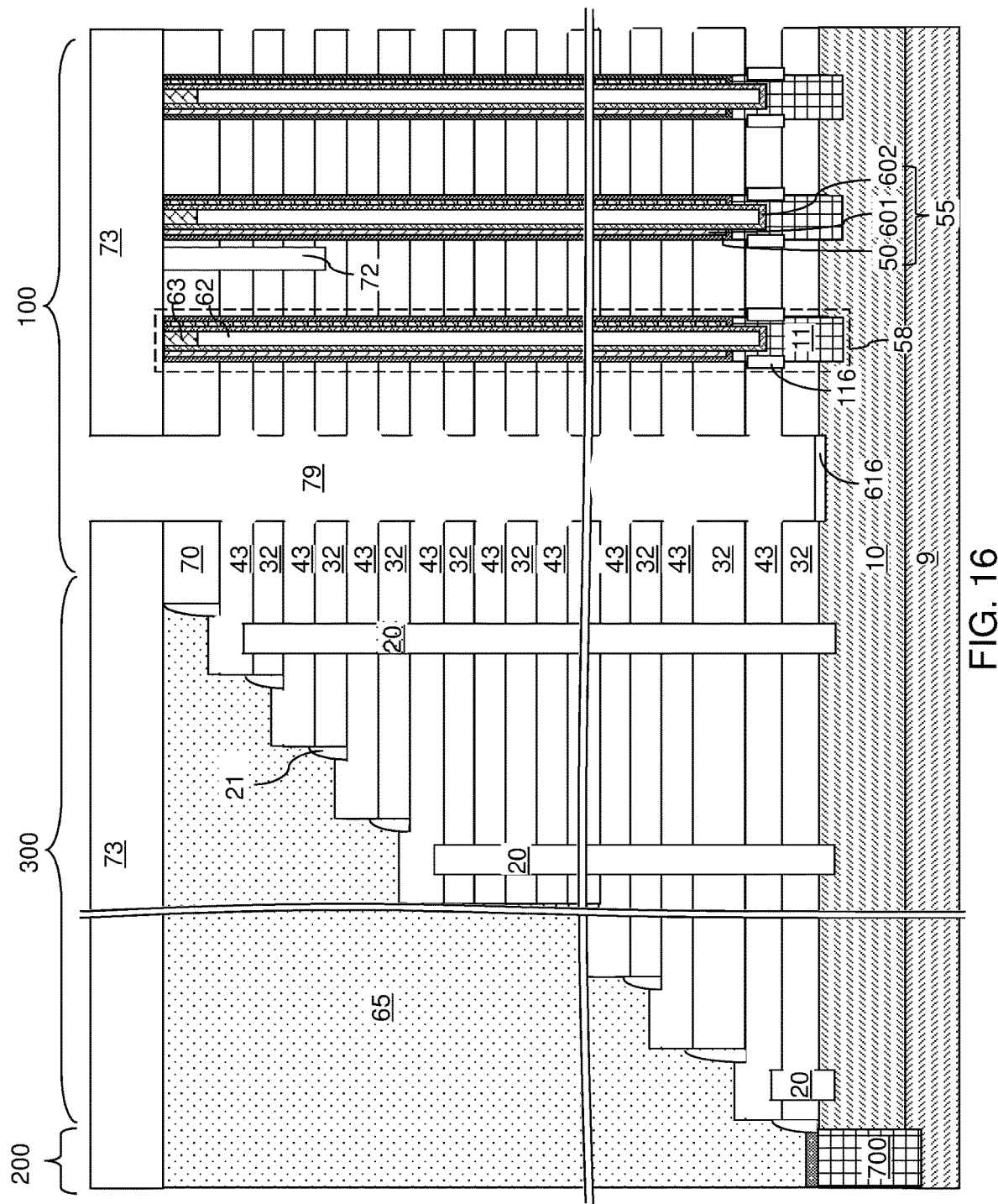
FIG. 16 is a schematic vertical cross-sectional view of the first exemplary structure after formation of backside recesses according to the first embodiment of the present disclosure.

Referring to FIGS. 16 and 17A, an etchant that selectively etches the second material of the sacrificial material layers 42 and the sacrificial pads 22 with respect to the first material of the insulating layers 32 can be introduced into the backside trenches 79, for example, using an etch process. Backside recesses 43 are formed in volumes from which the sacrificial material layers 42 and the sacrificial pads 22 are removed. The removal of the sacrificial material layers 42 and the sacrificial pads 22 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 and the sacrificial pads 22 can include silicon nitride, and the materials of the insulating layers 32 and the retro-stepped dielectric material portion 65 can be selected from silicon oxide or dielectric metal oxides.

The etch process that removes the second material selective to the first material and the outermost layer of the memory films 50 can be a wet etch process using a wet etch solution, or can be a gas phase (dry) etch process in which the etchant is introduced in a vapor phase into the backside trenches 79. For example, if the sacrificial material layers 42 and the sacrificial pads 22 include silicon nitride, the etch process can be a wet etch process in which the exemplary structure is immersed within a wet etch tank including phosphoric acid, which etches silicon nitride selective to silicon oxide, silicon, and various other materials used in the art. The dielectric pillar structure 20, the retro-stepped dielectric material portion 65, and the memory stack structures 55 provide structural support while the backside recesses 43 are present within volumes previously occupied by the sacrificial material layers 42 and the sacrificial pads 22.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the sacrificial material layers 42 and the sacrificial pads 22 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. Each backside recess 43 can have a first region having a uniform height throughout, a second region having a greater height and including volumes from which the sacrificial pads 22 are removed, and a third region having a different height and overlying a respective one of the dielectric pillar structures 20.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be used to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 17B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be used.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 17C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be used. In one embodiment, the metallic barrier layer 46A can consist essentially of a conductive metal nitride such as TiN.

Referring to FIG. 17D, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited using a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous electrically conductive material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact level dielectric layer 73.

The sacrificial material layers 42 and the sacrificial pads 22 can be replaced with replacement material portions that include electrically conductive layers 46 and optionally backside blocking dielectric layers 44. A backside cavity 79' is present in the portion of each backside trench 79 that is not filled with the backside blocking dielectric layer 44 and the continuous electrically conductive material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 17E:
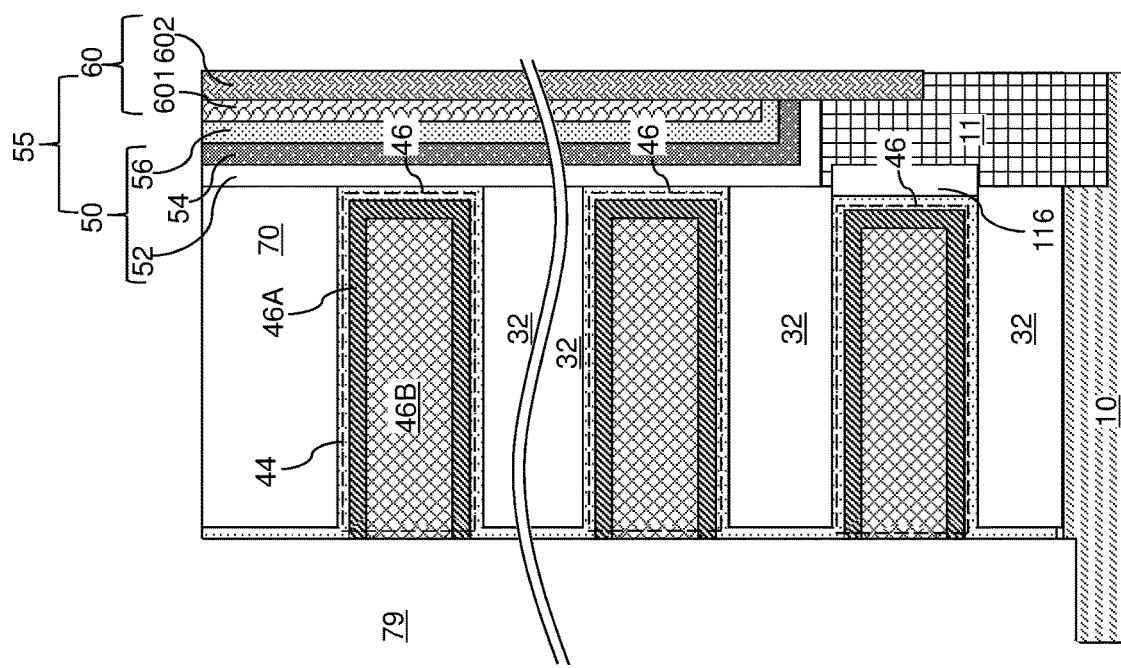
Figure 18A:
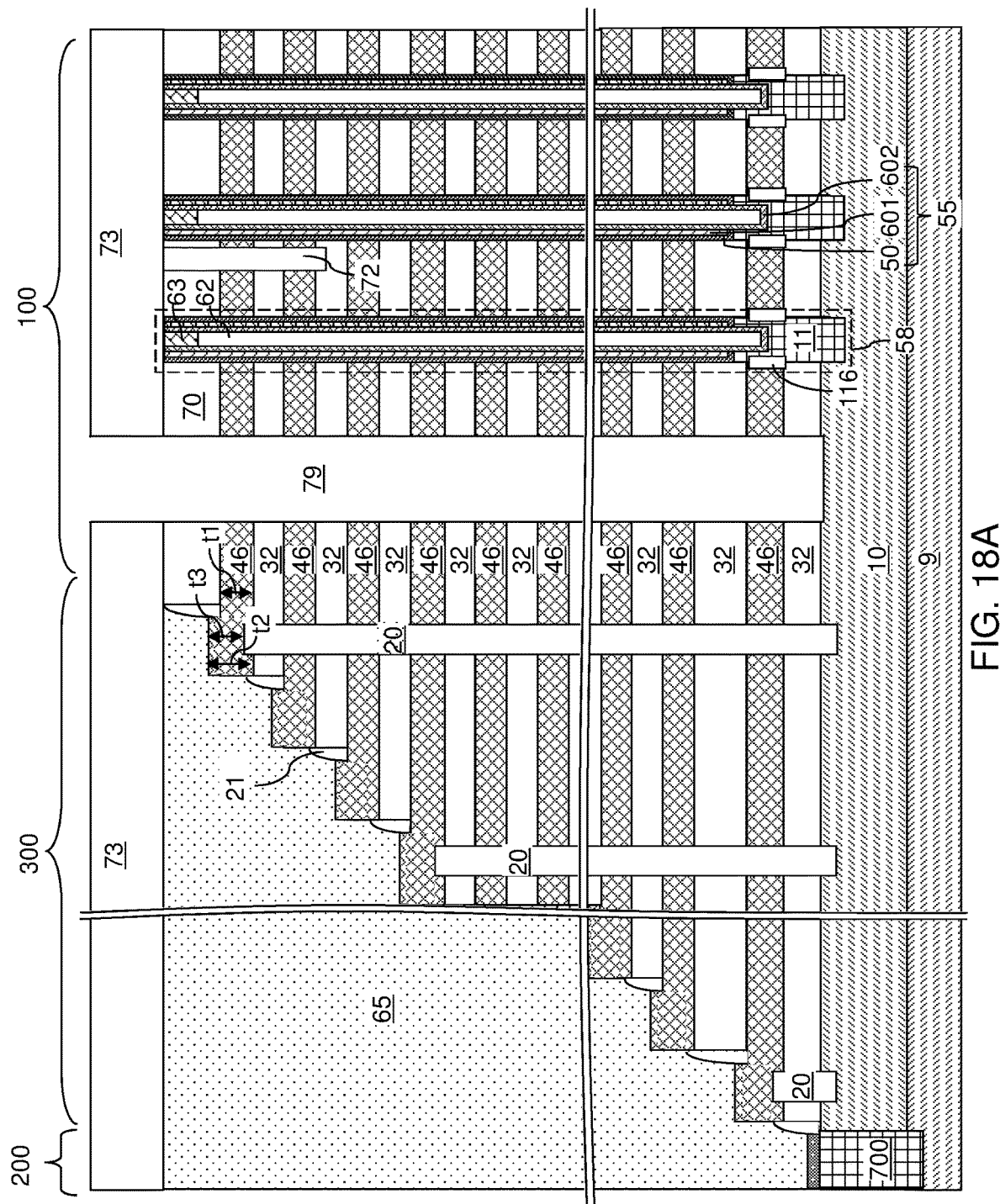
FIG. 18A is a schematic vertical cross-sectional view of the first exemplary structure after removal of a deposited conductive material from within the backside trench according to the first embodiment of the present disclosure.
Figure 18B:
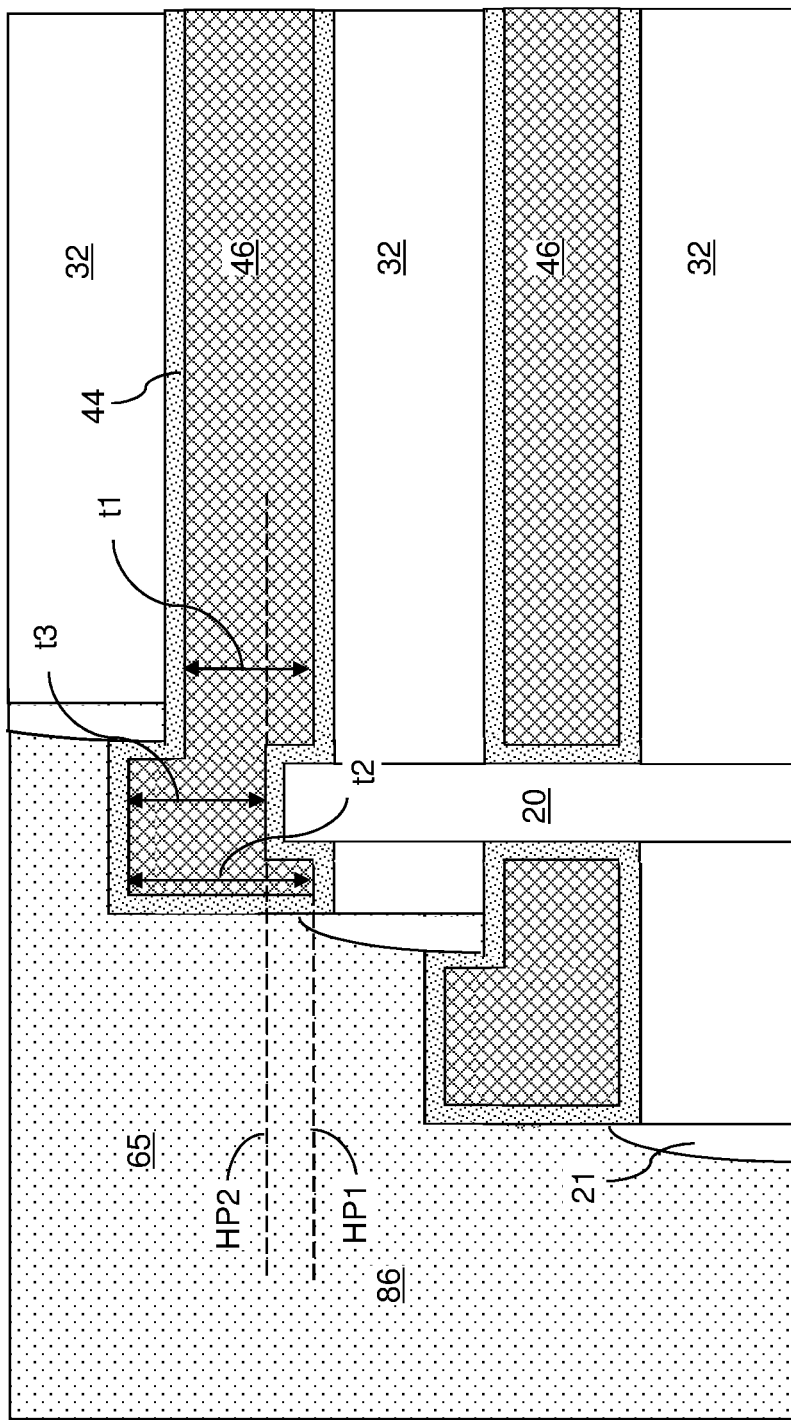
FIG. 18B is a magnified view of a portion of the staircase region of the first exemplary structure of FIG. 18A.

Referring to FIGS. 17E, 18A, and 18B, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure.

Each electrically conductive layer 46 can function as a combination of a plurality of control gate electrodes located at a same level and a word line electrically interconnecting, i.e., electrically connecting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be used. The planar dielectric portions 616 can be removed during removal of the continuous electrically conductive material layer 46L. A backside cavity 79' is present within each backside trench 79.

In one embodiment, each electrically conductive layer 46 that overlies a dielectric pillar structure 20 can be formed with a first thickness t1 in a first area that underlies an overlying one of the insulating layers 32 of the alternating stack of the insulating layers 32 and the electrically conductive layers 46, a second thickness t2 in a distal segment of a second area that laterally protrudes farther than the overlying one of the insulating layers 32 of the alternating stack (32, 46), and a third thickness t3 in a proximal segment of the second area located between the first area and the distal segment of the second area. The second thickness is greater than the first thickness. The third thickness t3 is different from the second thickness t2. In one embodiment, the third thickness t3 can be less than the second thickness. In another embodiment, the top surface of an underlying dielectric pillar structure 20 may be recessed below a horizontal plane including a top surface of an underlying insulating layer 32, and the third thickness t3 may be greater than the second thickness. In yet another embodiment, the top surface of an underlying dielectric pillar structure 20 may be coplanar with the horizontal plane including a top surface of an underlying insulating layer 32, and the third thickness t3 may be the same as the second thickness t2.

In one embodiment a portion of an electrically conductive layer 46 having the first thickness t1 can have a bottom surface within a first horizontal plane HP1, and a portion of the electrically conductive layer 46 having the second thickness t2 can have a bottom surface within the first horizontal plane HP1. In one embodiment, a portion of the electrically conductive layer 46 having the third thickness t3 can have a bottom surface within a second horizontal plane HP2 that is located above, or below, the first horizontal plane HP1.

Figure 19:
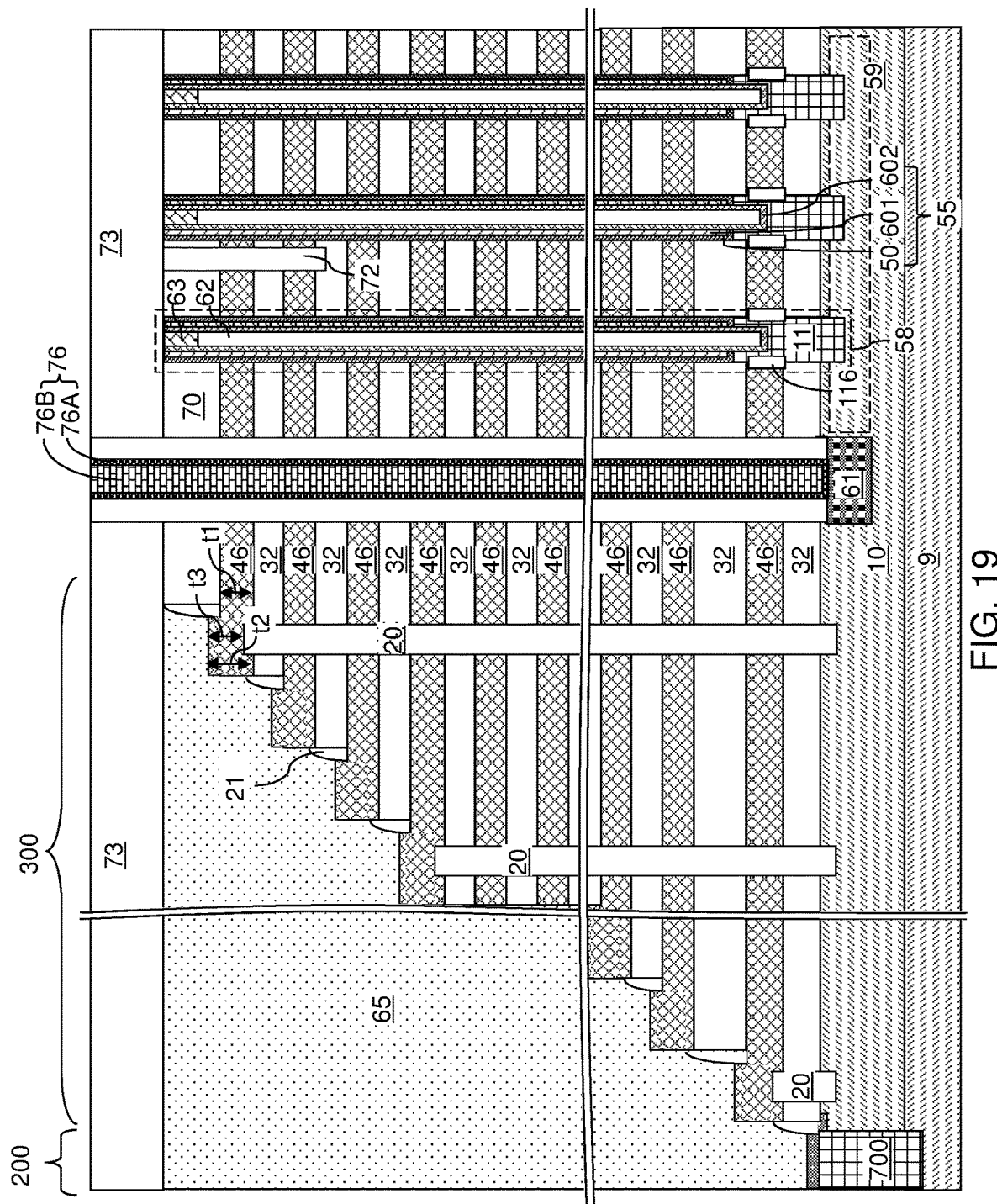
FIG. 19 is a schematic vertical cross-sectional view of the first exemplary structure after formation of insulating spacers and backside contact structures according to the first embodiment of the present disclosure.

Referring to FIG. 19, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be used.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not used, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective backside cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be used. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized using the contact level dielectric layer 73 overlying the alternating stack (32, 46) as a stopping layer. If chemical mechanical planarization (CMP) process is used, the contact level dielectric layer 73 can be used as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is used, the backside contact via structure 76 can contact a sidewall of the backside blocking dielectric layer 44.

Figure 20A:
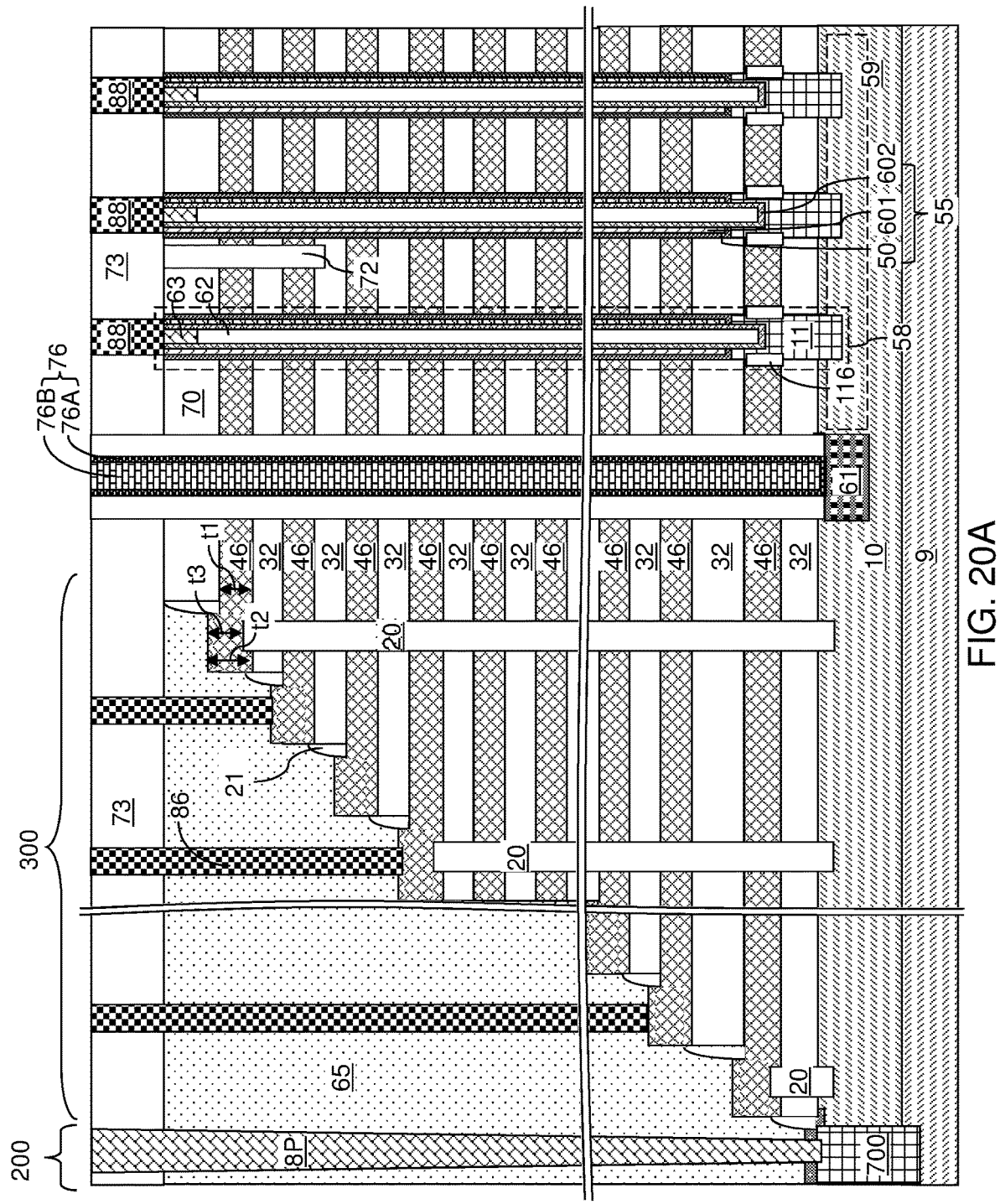
FIG. 20A is a schematic vertical cross-sectional view of the first exemplary structure after formation of additional contact via structures according to the first embodiment of the present disclosure.
Figure 20B:
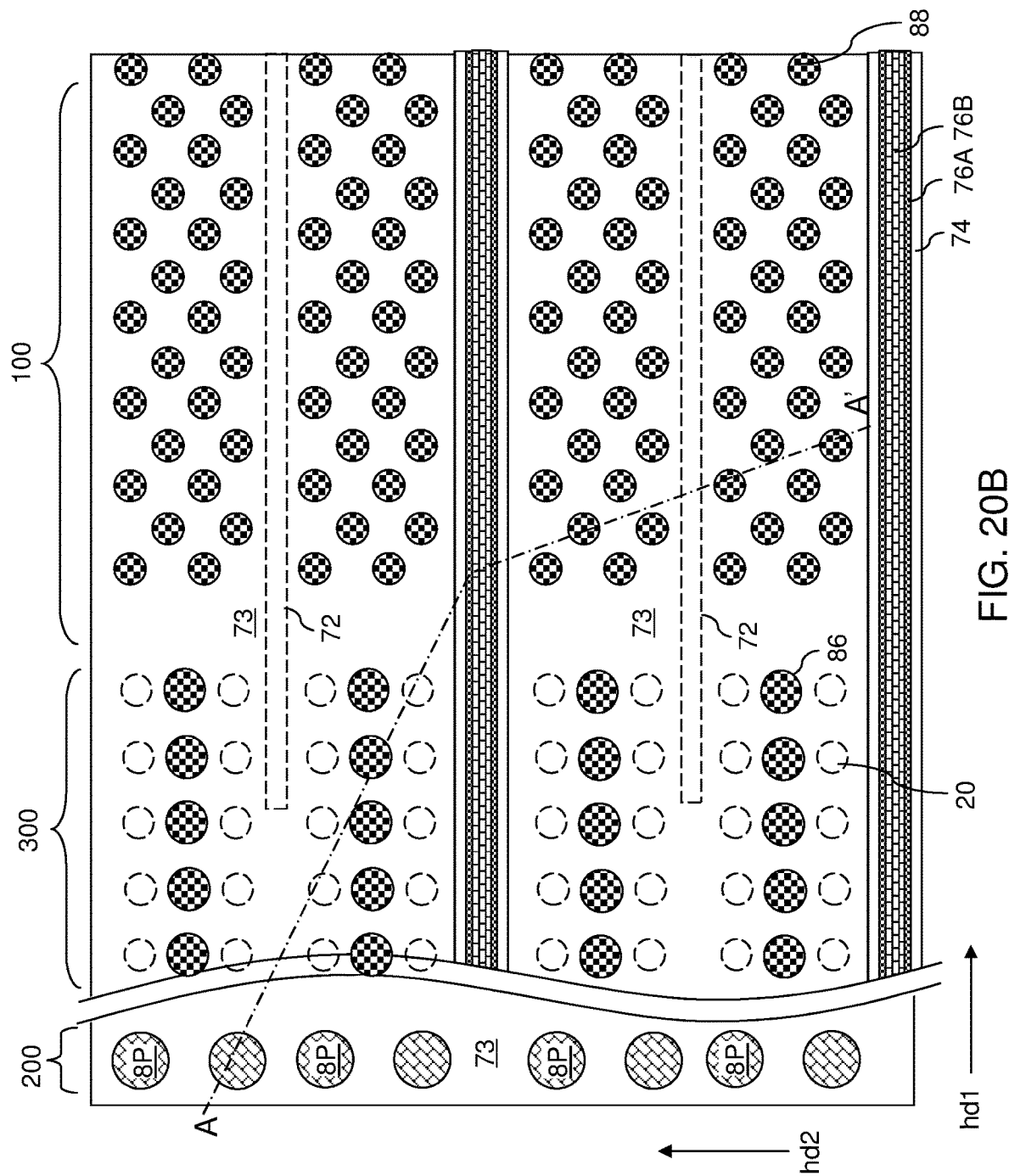
FIG. 20B is a top-down view of the first exemplary structure of FIG. 20A. The vertical plane A-A' is the plane of the schematic vertical cross-sectional view of FIG. 20A.
Figure 20C:
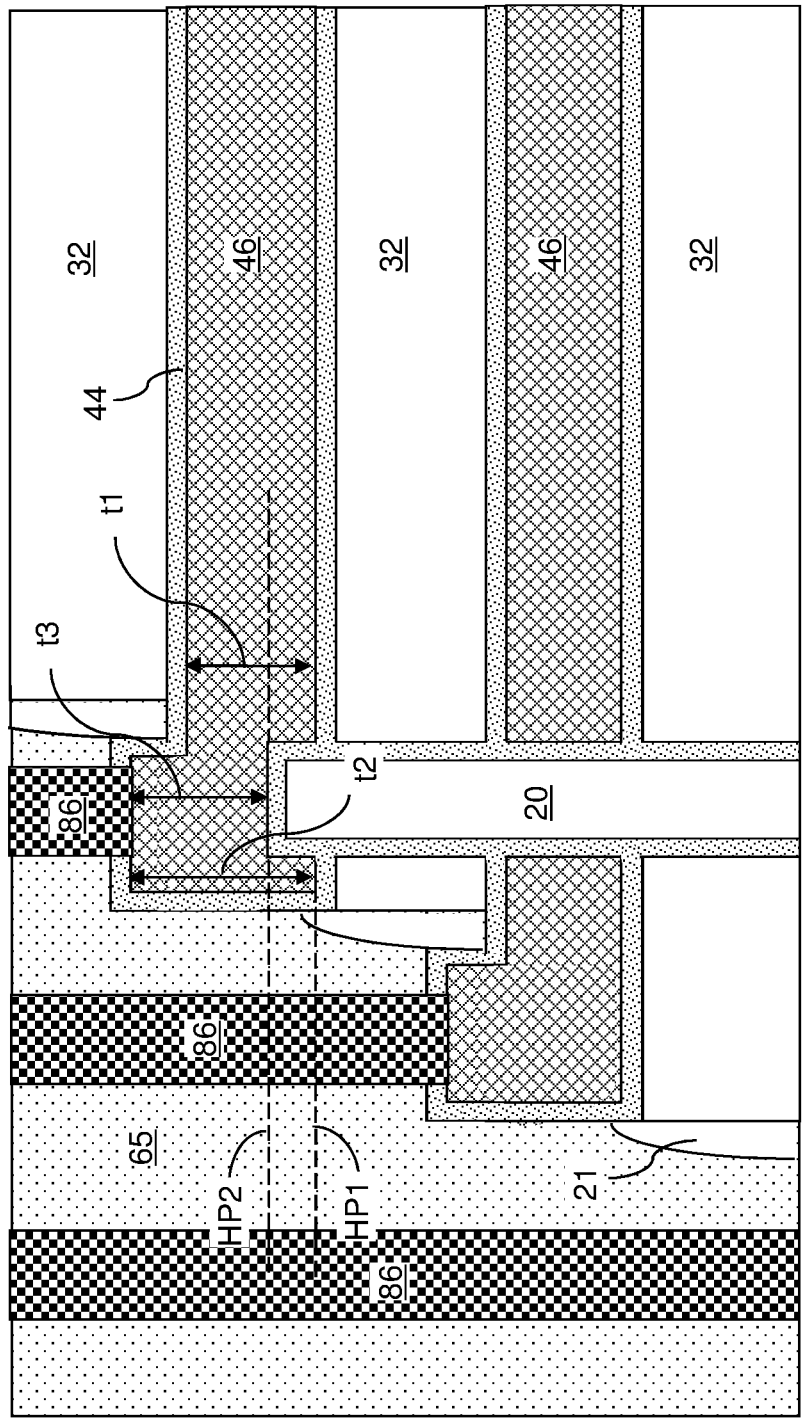
FIG. 20C is a magnified view of a portion of the staircase region of the first exemplary structure of FIG. 20A.

Referring to FIGS. 20A-20C, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices. Each of the word line contact via structures 86 can contact a portion of a respective electrically conductive layer 46 having the second thickness t2 and/or a portion of the respective electrically conductive layer having the third thickness t3.

Figure 21:
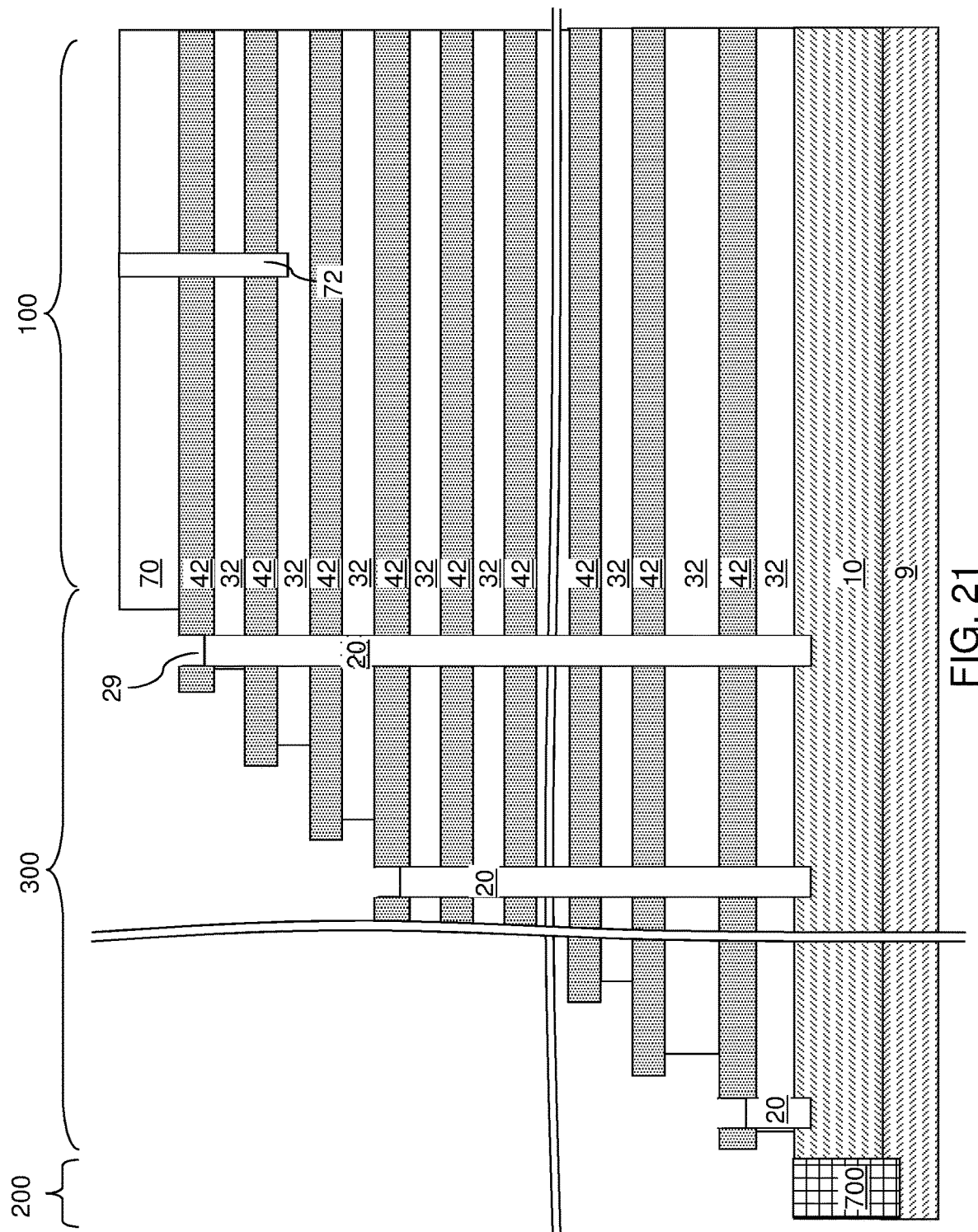
FIG. 21 is a schematic vertical cross-sectional view of a second exemplary structure after formation of stepped surfaces and isotropic recessing of the insulating layers and the dielectric pillar structures according to a second embodiment of the present disclosure.

Referring to FIG. 21, a second exemplary structure according to a second embodiment of the present disclosure can be derived from the first exemplary structure of FIGS. 6A and 6B by recessing of the insulating layers 32 and the dielectric pillar structures 20 selective to the sacrificial material layers 42. For example, if the insulating layer 32, the insulating cap layer 70, and the dielectric pillar structures 20 include silicate glass materials and if the sacrificial material layers 42 include silicon nitride, a wet etch process using dilute hydrofluoric acid can be used to isotropically etch physically exposed surface portions of the insulating layers 32, the dielectric pillar structures 20, and the insulating cap layer 70. Sidewalls of the insulating layers 32 are laterally recessed while top surfaces of the dielectric pillar structures 20 are vertically recessed by the isotropic etch process. Undercut regions are formed underneath end portions of the sacrificial material layers 42 at the levels of the insulating layers 32.

A top surface of each dielectric pillar structure 20 can be vertically recessed relative to a horizontal surface among the stepped surfaces. Recess cavities 29 are formed above each recessed top surface of the dielectric pillar structures 20. The depth of each recess cavity 29 can be in a range from 3% to 150%, such as from 10% to 80%, of the thickness of the sacrificial material layer 42 that laterally surrounds the recess cavity 29. A periphery of a recessed surface of a dielectric pillar structure 20 may contact a sidewalls of a sacrificial material layer 42, or may contact a sidewall of an insulating layer 32 that underlies a horizontal surface of the stepped surfaces.

Figure 22:
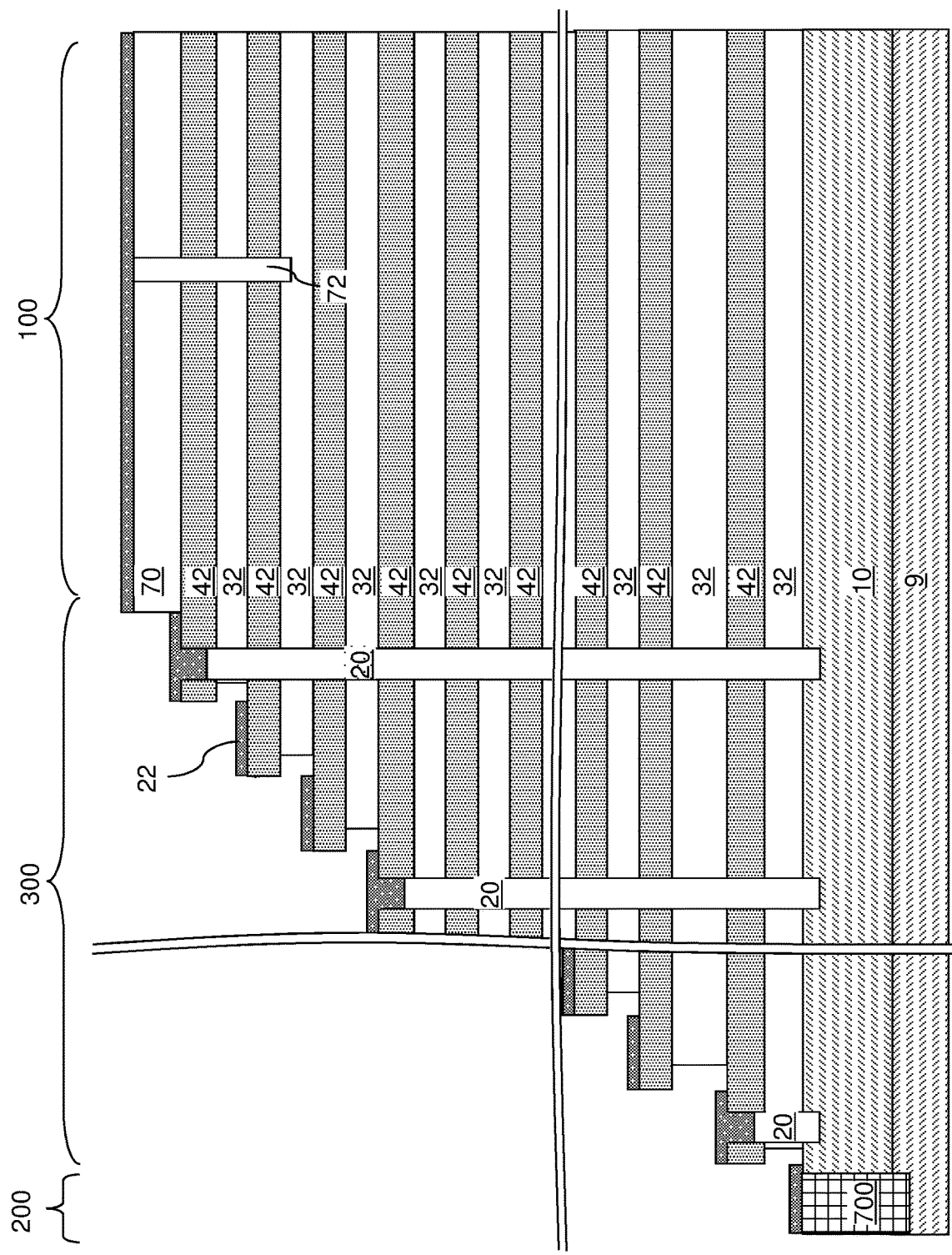
FIG. 22 is a schematic vertical cross-sectional view of the second exemplary structure after formation of sacrificial pads according to a second embodiment of the present disclosure.

Referring to FIG. 22, a sacrificial pad material is anisotropically deposited in the recess cavities 29, on physically exposed horizontal surfaces of the sacrificial material layers 42, on sidewalls of the sacrificial material layers 42, and over the insulating cap layer 70 without depositing the sacrificial pad material in the undercut regions. The sacrificial pad material may be the same as the material of the sacrificial material layers 42. For example, the sacrificial material layers 42 can include silicon nitride, and the sacrificial pad material can include silicon nitride. In one embodiment, the sacrificial pad material can be deposited by plasma enhanced chemical vapor deposition (PECVD) process. The lateral thickness of the deposited sacrificial pad material on the sidewalls of the sacrificial material layers 42 is less than the vertical thickness of the deposited sacrificial pad material on horizontal surfaces of the sacrificial material layers 42 due to the anisotropic nature of the deposition process. The duration of the deposition process that deposits the sacrificial pad material can be selected such that each recess cavity 29 is filled with a respective portion of the sacrificial pad material. Each portion of the deposited sacrificial pad material that is deposited on horizontal surfaces of the sacrificial material layers 42 constitutes a sacrificial pad 22.

Optionally but not necessarily, the sacrificial pad material may be isotropically recessed by performing an isotropic etch process. The isotropic etch process etches the sacrificial pad material selective to the materials of the insulating layers 32 and the insulating cap layer 70. For example, if the sacrificial pad material includes silicon nitride and if the insulating layers 32 include silicon oxide, the isotropic etch process can include a wet etch process using hot phosphoric acid. In case the sacrificial pad material is isotropically recessed, the sacrificial pad material can be removed from sidewalls of the sacrificial material layers 42, and the sacrificial pads 22 may not laterally extend farther than the sidewall of an underlying sacrificial material layer 42.

Figure 23:
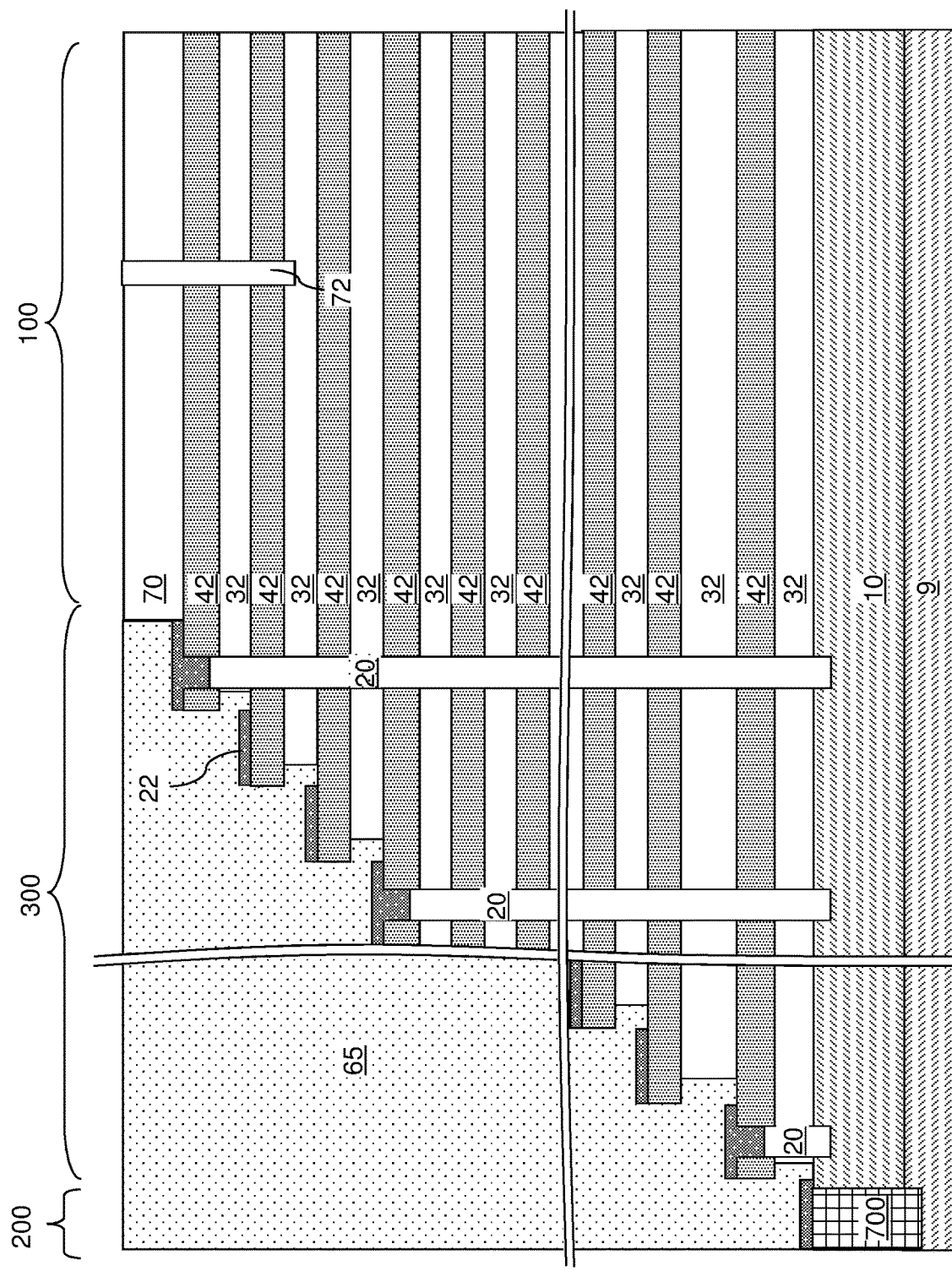
FIG. 23 is a schematic vertical cross-sectional view of the second exemplary structure after formation of a retro-stepped dielectric material portion according to the second embodiment of the present disclosure.

Referring to FIG. 23, the processing steps of FIG. 11 can be performed to form a retro-stepped dielectric material portion 65.

Figure 24:
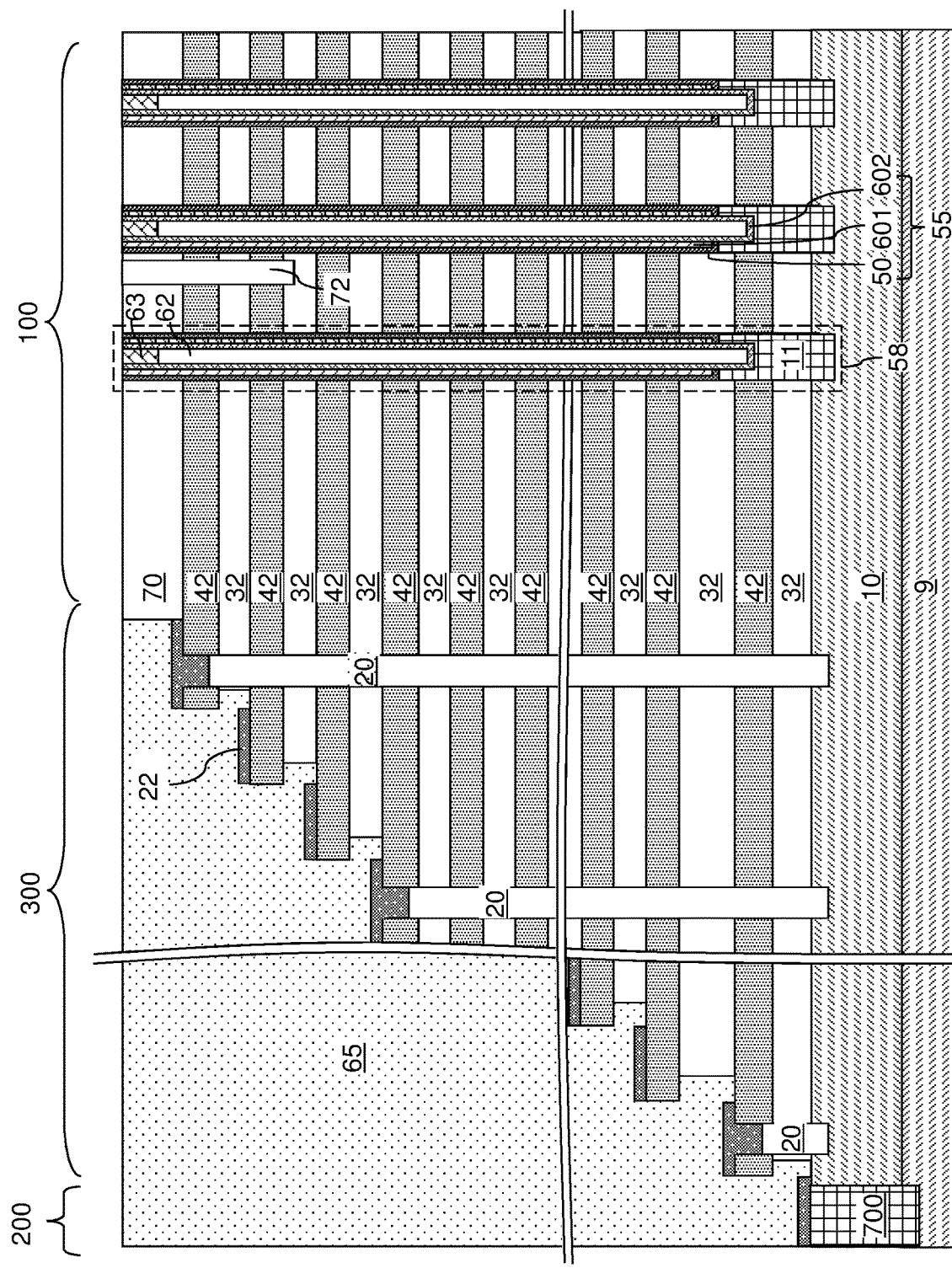
FIG. 24 is a schematic vertical cross-sectional view of the second exemplary structure after formation of memory stack structures according to the second embodiment of the present disclosure.

Referring to FIG. 24, the processing steps of FIGS. 12A and 12B, 13A-13H, and 14 can be performed to form memory openings 49 and memory opening fill structures 58 as in the first embodiment.

Figure 25:
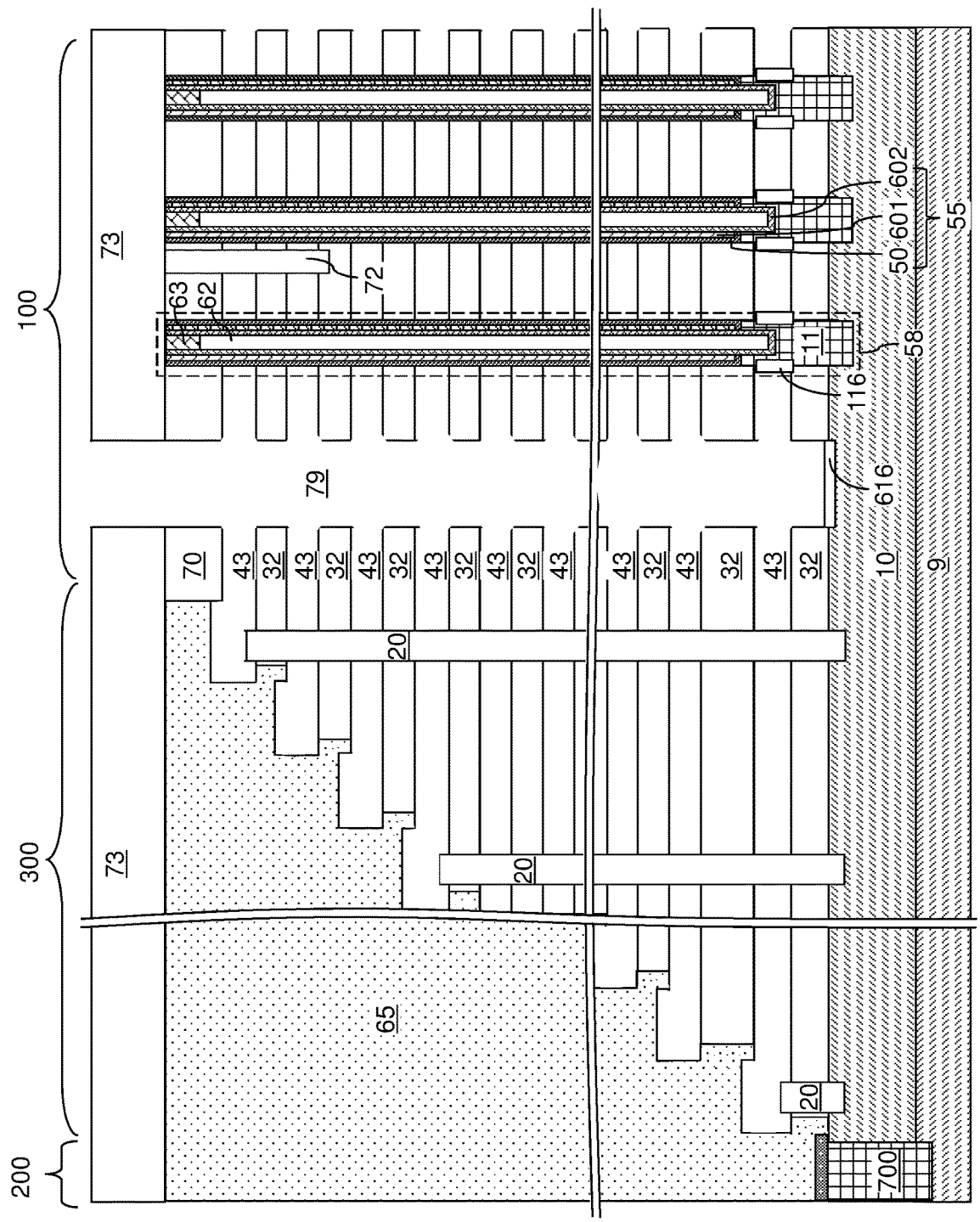
FIG. 25 is a schematic vertical cross-sectional view of the second exemplary structure after formation of backside trenches backside recesses according to the second embodiment of the present disclosure.

Referring to FIG. 25, the processing steps of FIGS. 16 and 17A can be performed to remove the sacrificial material layers 42 and the sacrificial pads 22. Backside recesses 43 are formed in volumes from which the sacrificial material layers 42 and the sacrificial pads 22 are removed.

Figure 26A:
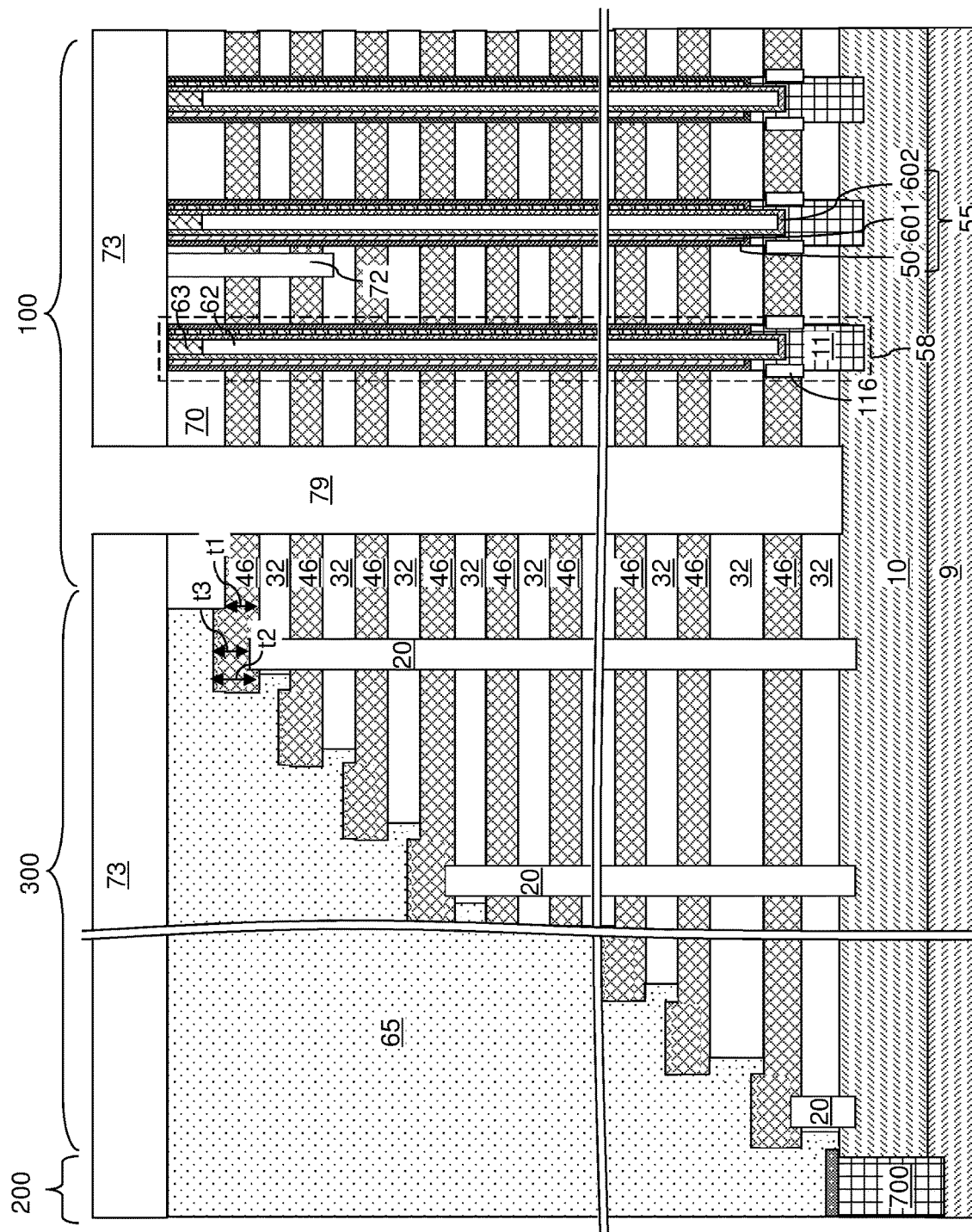
FIG. 26A is a schematic vertical cross-sectional view of the second exemplary structure after formation of electrically conductive layers according to the second embodiment of the present disclosure.
Figure 26B:
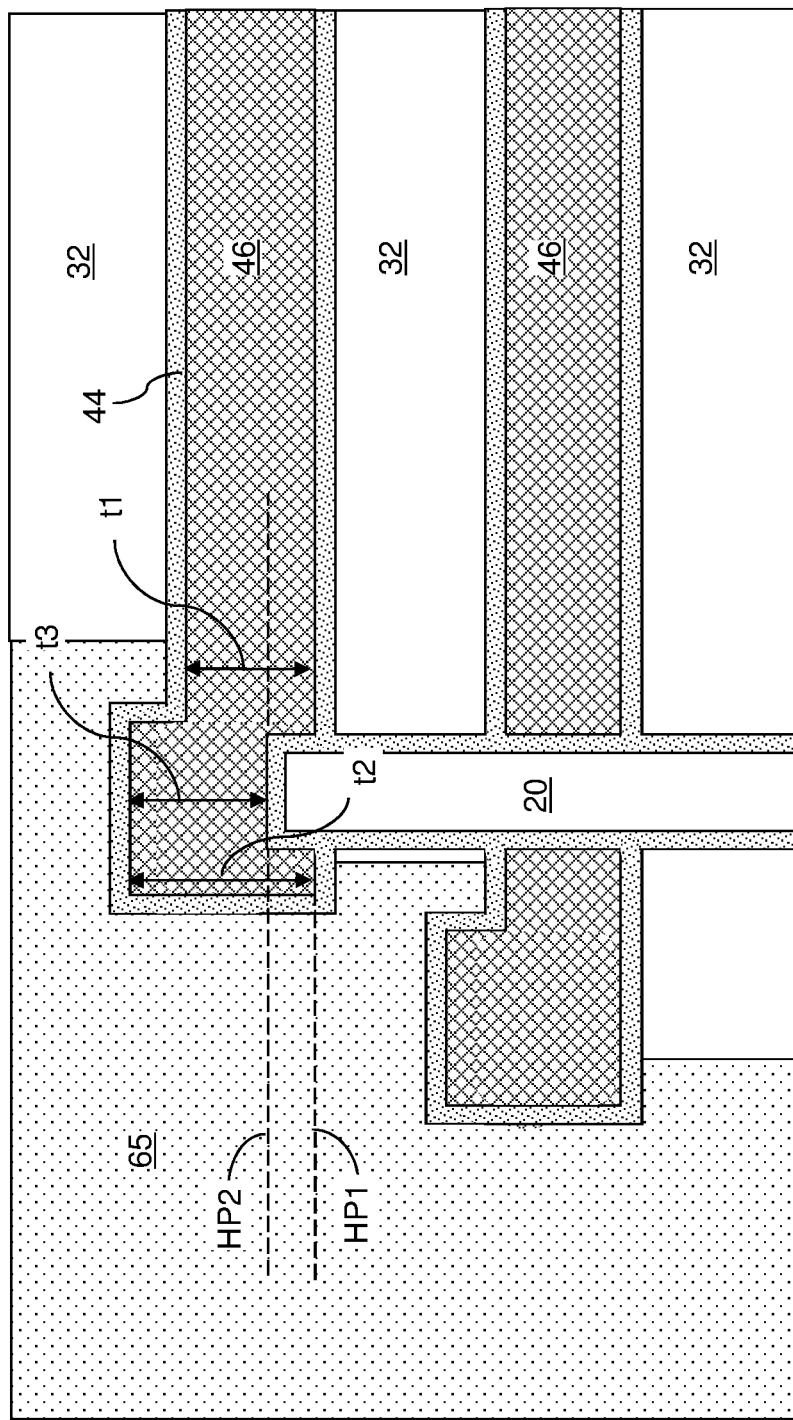
FIG. 26B is a magnified view of a portion of the staircase region of the second exemplary structure of FIG. 26A.

Referring to FIGS. 26A and 26B, the processing steps of FIGS. 17B-17E and 18A and 18B can be performed to form backside blocking dielectric layers 44 and electrically conductive layers 46. In one embodiment, each electrically conductive layer 46 that overlies a dielectric pillar structure 20 can be formed with a first thickness t1 in a first area that underlies an overlying one of the insulating layers 32 of the alternating stack of the insulating layers 32 and the electrically conductive layers 46, a second thickness t2 in a distal segment of a second area that laterally protrudes farther than the overlying one of the insulating layers 32 of the alternating stack (32, 46), and a third thickness t3 in a proximal segment of the second area located between the first area and the distal segment of the second area. The second thickness is greater than the first thickness. The third thickness t3 is different from the second thickness t2. In one embodiment, the third thickness t3 can be less than the second thickness. In another embodiment, the top surface of an underlying dielectric pillar structure 20 may be recessed below a horizontal plane including a top surface of an underlying insulating layer 32, and the third thickness t3 may be greater than the second thickness. In yet another embodiment, the top surface of an underlying dielectric pillar structure 20 may be coplanar with the horizontal plane including a top surface of an underlying insulating layer 32, and the third thickness t3 may be the same as the second thickness t2.

In one embodiment a portion of an electrically conductive layer 46 having the first thickness t1 can have a bottom surface within a first horizontal plane HP1, and a portion of the electrically conductive layer 46 having the second thickness t2 can have a bottom surface within the first horizontal plane HP1. In one embodiment, a portion of the electrically conductive layer 46 having the third thickness t3 can have a bottom surface within a second horizontal plane HP2 that is located above, or below, the first horizontal plane HP1.

Figure 27A:
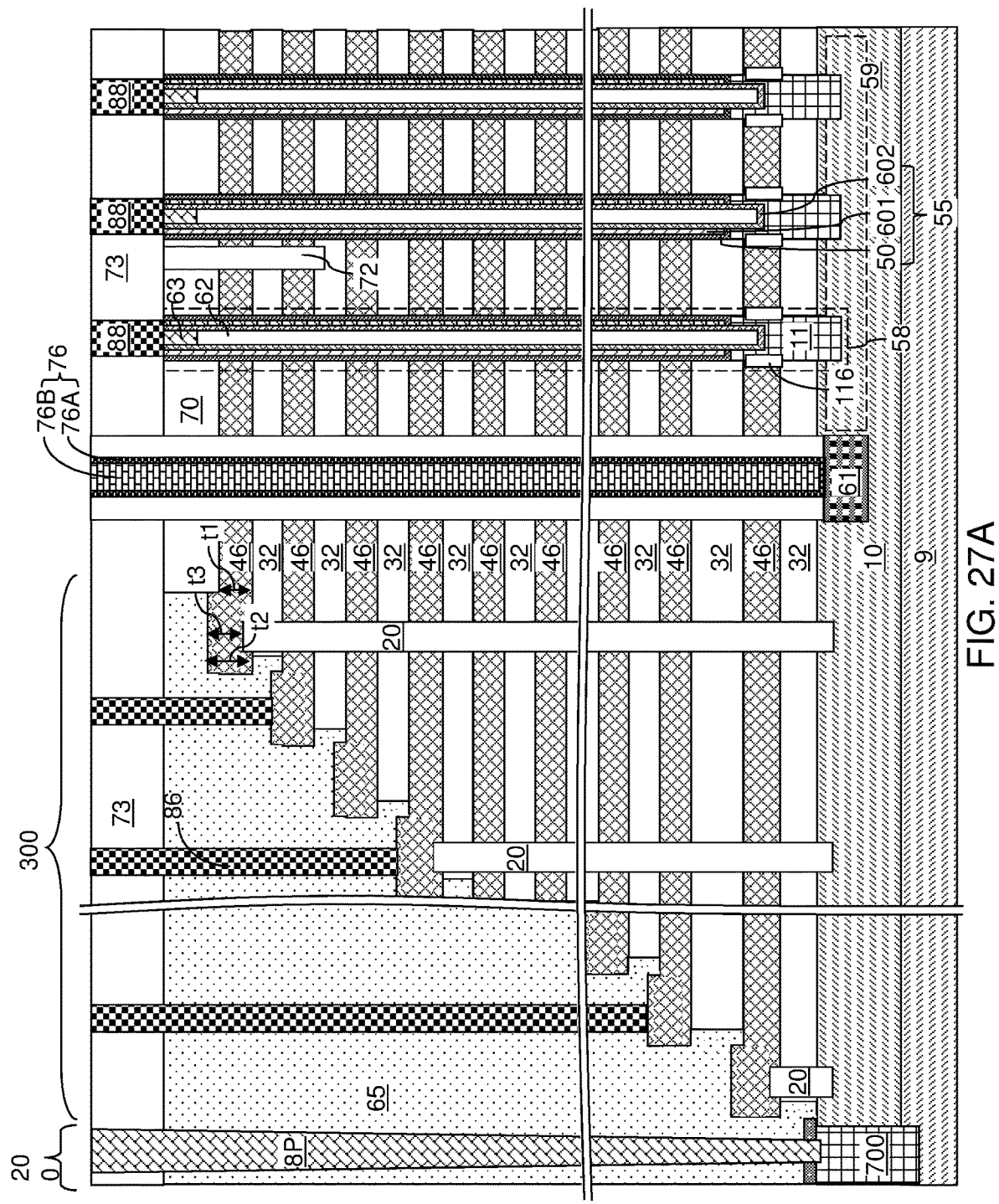
FIG. 27A is a schematic vertical cross-sectional view of the second exemplary structure after formation of insulating spacers, backside contact structures, and additional contact via structures according to the second embodiment of the present disclosure.
Figure 27B:
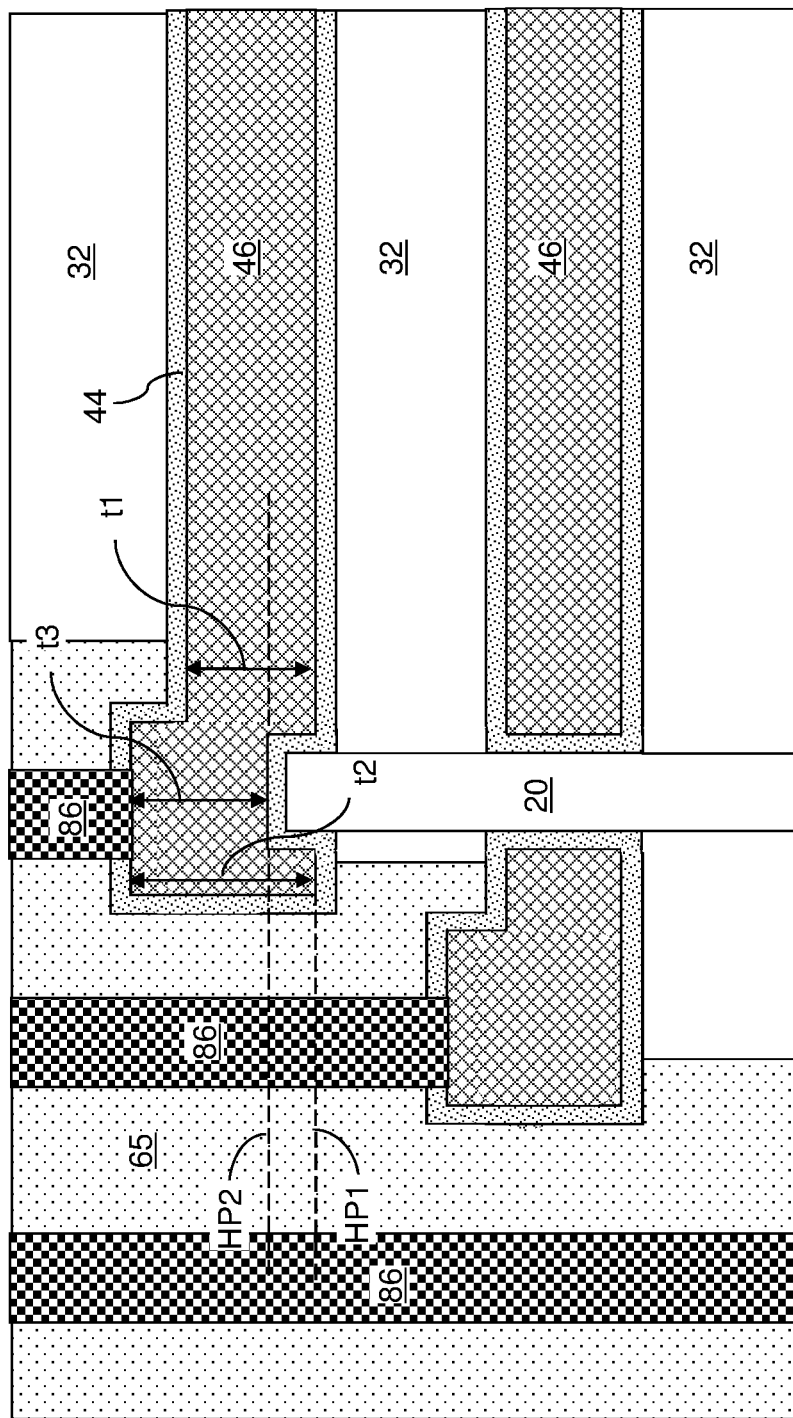
FIG. 27B is a magnified view of a portion of the staircase region of the second exemplary structure of FIG. 20A.

Referring to FIGS. 27A and 27B, the processing steps of FIGS. 19, 20A, and 20B can be performed to form a source region 61 underneath each backside trench 79, an insulating spacer 74 and a backside contact via structure 76 within each backside trench 79, horizontal semiconductor channels 59 underlying the memory stack structures 55, and various contact via structures (88, 86, 8P). Each of the word line contact via structures 86 can contact a portion of a respective electrically conductive layer 46 having the second thickness t2 and/or a portion of the respective electrically conductive layer having the third thickness t3.

Referring to all drawings and according to various embodiments of the present disclosure, a three-dimensional memory device is provided, which comprises: an alternating stack of insulating layers 32 and electrically conductive layers 46 located over a substrate (9, 10); memory stack structures 55 extending through the alternating stack (32, 46), wherein each of the memory stack structures 55 comprises a memory film 50 and a vertical semiconductor channel 60; and a staircase region 300 including stepped surfaces of the alternating stack (32, 46), wherein the electrically conductive layers 46 have lateral extents that decrease with a vertical distance from the substrate (9, 10) within the staircase region 300, wherein a first of the electrically conductive layers 46 has a first thickness t1 in a first area that underlies an overlying one of the insulating layers 32 of the alternating stack (32, 46), a second thickness t2 in a distal segment of a second area that laterally protrudes farther than the overlying one of the insulating layers 32 of the alternating stack (32, 46), and a third thickness t1 in a proximal segment of the second area located between the distal segment of the second area and the first area, wherein the second thickness t2 is greater than the first thickness t1, and the third thickness t3 is different from the second thickness t2.

In one embodiment, the three-dimensional memory device comprises dielectric pillar structures 20 having different heights, located in the staircase region 300, and extending through a respective subset of layers within the alternating stack (32, 42).

In one embodiment, the at least one of the electrically conductive layers 46 has a planar bottom surface located within a first horizontal plane HP1 within the first area and within the distal segment of the second area, and has an elevated bottom surface within a second horizontal plane HP2 that is located above the first horizontal plane HP1 within the proximal segment of the second area. In one embodiment, the elevated bottom surface overlies a top surface of one of the dielectric pillar structures 20.

In one embodiment, a backside blocking dielectric layer 44 is located between each neighboring pair of an insulating layer 32 and an electrically conducive layer 46 within the alternating stack (32, 46) and between the electrically conductive layers 46 and each of the memory stack structures 55. In one embodiment, the backside blocking dielectric layer 44 is located between each of the dielectric pillar structure 20 and a respective overlying one of the electrically conductive layers 46.

In one embodiment, the three-dimensional memory device comprises: a retro-stepped dielectric material portion 65 overlying the stepped surfaces of the alternating stack (32, 46); and insulating spacers 21 contacting a sidewall of a respective one of the insulating layers 32 and the retro-stepped dielectric material portion 65, wherein one of the insulating spacers 21 overlies a peripheral portion of the first area of the at least one of the electrically conductive layers 46 as illustrated in the first exemplary structure.

In one embodiment, each insulating layer 32 that underlies a respective electrically conducive layer 46 within the alternating stack (32, 46) is laterally recessed relative to a sidewall of the respective electrically conductive layer 46 toward a memory array region 100 in which the memory stack structures 55 are located as illustrated in the second exemplary structure.

The various embodiments of the present disclosure can be used to provide a thickened end portion for electrically conductive layers 46. The thickened portions of the electrically conductive layers 46 can be used to provide a robust etch stop structure for word line contact via structures 86. Further, the dielectric pillar structures 20 are formed below the electrically conductive layers 46. The locations of the word line contact via structures 86 can be selected irrespective of the locations of the dielectric pillar structures 20 since the dielectric pillar structures 20 are located below stepped bottom surfaces of a retro-stepped dielectric material portion 65. Thus, the word line contact via structures 86 can be formed at the center of a thickened portion of each electrically conductive layer 46. Inter-layer electrical connections due to overextension of contact via structures can be avoided by the increased thickness of the electrically conductive layers at the end portions. The electrically conductive layers 46 according to various embodiments of the present disclosure can provide high reliability electrical contact with the word line contact via structures 86.

Although the foregoing refers to particular preferred embodiments, it will be understood that the claims are not so limited. It will occur to those of ordinary skill in the art that various modifications may be made to the disclosed embodiments and that such modifications are intended to be within the scope of the claims. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
an alternating stack of insulating layers and electrically conductive layers located over a substrate;
memory stack structures extending through the alternating stack, wherein each of the memory stack structures comprises a memory film and a vertical semiconductor channel;
a staircase region including stepped surfaces of the alternating stack, wherein the electrically conductive layers have lateral extents that decrease with a vertical distance from the substrate within the staircase region; and
dielectric pillar structures having different heights, located in the staircase region, and extending through a respective subset of layers within the alternating stack
wherein at least one of the electrically conductive layers has a first thickness in a first area that underlies an overlying one of the insulating layers of the alternating stack, a second thickness in a distal segment of a second area that laterally protrudes farther than the overlying one of the insulating layers of the alternating stack, and a third thickness in a proximal segment of the second area located between the distal segment of the second area and the first area, wherein the second thickness is greater than the first thickness, and the third thickness is different from the second thickness; and
wherein the at least one of the electrically conductive layers has a planar bottom surface located within a first horizontal plane within the first area and within the distal segment of the second area, and has an elevated bottom surface within a second horizontal plane that is located above the first horizontal plane within the proximal segment of the second area.

2. The three-dimensional memory device of claim 1, wherein the elevated bottom surface overlies a top surface of one of the dielectric pillar structures.

3. A three-dimensional memory device of, comprising:
an alternating stack of insulating layers and electrically conductive layers located over a substrate;
memory stack structures extending through the alternating stack, wherein each of the memory stack structures comprises a memory film and a vertical semiconductor channel; and
a staircase region including stepped surfaces of the alternating stack, wherein the electrically conductive layers have lateral extents that decrease with a vertical distance from the substrate within the staircase region;
wherein at least one of the electrically conductive layers has a first thickness in a first area that underlies an overlying one of the insulating layers of the alternating stack, a second thickness in a distal segment of a second area that laterally protrudes farther than the overlying one of the insulating layers of the alternating stack, and a third thickness in a proximal segment of the second area located between the distal segment of the second area and the first area, wherein the second thickness is greater than the first thickness, and the third thickness is different from the second thickness; and
wherein each insulating layer that underlies a respective electrically conductive layer within the alternating stack is laterally recessed relative to a sidewall of the respective electrically conductive layer toward a memory array region in which the memory stack structures are located.

4. A method of forming a three-dimensional memory device, comprising:
forming an alternating stack of insulating layers and sacrificial material layers over a substrate;
forming dielectric pillar structures through the alternating stack;
forming stepped surfaces by patterning the alternating stack in a staircase region, wherein the sacrificial material layers have lateral extents that decrease with a vertical distance from the substrate in the staircase region;
vertically recessing top surfaces of the dielectric pillar structures below the stepped surfaces to form recess cavities;
forming sacrificial pads by depositing a sacrificial pad material in the recess cavities and over the stepped surfaces;
forming a retro-stepped dielectric material portion over the sacrificial pads;
forming memory stack structures extending through the alternating stack, wherein each of the memory stack structures comprises a memory film and a vertical semiconductor channel; and
replacing the sacrificial material layers and the sacrificial pads with replacement material portions that comprise electrically conductive layers.

5. The method of claim 4, wherein at least one of the electrically conductive layers is formed with a first thickness in a first area that underlies an overlying one of the insulating layers of the alternating stack, a second thickness in a distal segment of a second area that laterally protrudes farther than the overlying one of the insulating layers of the alternating stack, and a third thickness in a proximal segment of the second area located between the first area and the distal segment of the second area, wherein the second thickness is greater than the first thickness, and the third thickness is different from the second thickness.

6. The method of claim 4, further comprising:
forming a conformal insulating material layer over the stepped surfaces of the alternating stack; and
anisotropically etching the conformal insulating material layer using an anisotropic etch process, wherein insulating spacers are formed on sidewalls of the insulating layers, and top surfaces of the dielectric pillar structures are recessed below horizontal surfaces within the stepped surfaces.

7. The method of claim 6, wherein:
the insulating layers and the conformal insulating material layer comprise materials selected from undoped silicate glass, doped silicate glasses, or organosilicate glass; and the anisotropic etch process etches materials of the insulating layers and the conformal insulating material layer selective to a material of the sacrificial material layers.

8. The method of claim 6, further comprising:
anisotropically depositing the sacrificial pad material in the recess cavities, physically exposed horizontal surfaces of the sacrificial material layers, and on outer sidewalls of the insulating spacers; and
isotropically recessing the sacrificial pad material, wherein remaining portions of the sacrificial pad material constitute the sacrificial pads.

9. The method of claim 4, further comprising forming contact via structures through the retro-stepped dielectric material portion and on a top surface of a respective one of the electrically conductive layers.

10. The method of claim 4, further comprising laterally recessing sidewalls of the insulating layers while vertically recessing top surfaces of the dielectric pillar structures by performing an isotropic etch process that etches a material of the insulating layers selective to a material of the sacrificial material layers, wherein undercut regions are formed underneath end portions of the sacrificial material layers, and the sacrificial pads are formed over the end portions of the sacrificial material layers.

11. The method of claim 10, further comprising:
anisotropically depositing the sacrificial pad material in the recess cavities, physically exposed horizontal surfaces of the sacrificial material layers, and on sidewalls of the sacrificial material layers without depositing the sacrificial pad material in the undercut regions; and
isotropically recessing the sacrificial pad material, wherein remaining portions of the sacrificial pad material constitute the sacrificial pads.

12. The method of claim 4, further comprising:
forming a backside trench through the alternating stack after formation of the memory stack structures;
forming backside recesses by removing the sacrificial material layers and the sacrificial pads selective to the insulating layers, wherein the replacement material portions are formed in the backside recesses.

13. The method of claim 12, further comprising:
forming a backside blocking dielectric layer in the backside recesses on physically exposed portions of outer sidewalls of the memory stack structures; and
forming the electrically conductive layer in remaining volumes of the backside recesses after formation of the backside blocking dielectric layer.

14. The method of claim 13, wherein the backside blocking dielectric layer is formed directly on top surfaces of the dielectric pillar structures.

15. The method of claim 14, wherein the backside blocking dielectric layer is formed on physically exposed portions of sidewalls of the dielectric pillar structures and on top surfaces of the dielectric pillar structures.

* * * * *